US009035411B2

(12) United States Patent
Ueno et al.

(10) Patent No.: US 9,035,411 B2
(45) Date of Patent: May 19, 2015

(54) SEMICONDUCTOR DEVICE

(75) Inventors: Toshihide Ueno, Kanagawa (JP); Masao Kinoshita, Tokyo (JP); Takanori Shimizu, Tokyo (JP)

(73) Assignees: SONY CORPORATION, Tokyo (JP); NEC CORPORATION, Tokyo (JP)

( * ) Notice: Subject to any disclaimer, the term of this patent is extended or adjusted under 35 U.S.C. 154(b) by 796 days.

(21) Appl. No.: 13/120,704

(22) PCT Filed: Oct. 2, 2009

(86) PCT No.: PCT/JP2009/067258
§ 371 (c)(1),
(2), (4) Date: Jun. 1, 2011

(87) PCT Pub. No.: WO2010/038871
PCT Pub. Date: Apr. 8, 2010

(65) Prior Publication Data
US 2011/0235965 A1   Sep. 29, 2011

(30) Foreign Application Priority Data
Oct. 3, 2008   (JP) .................................. 2008-258683

(51) Int. Cl.
| G02B 6/122 | (2006.01) |
| G02B 6/42 | (2006.01) |
| H01L 25/065 | (2006.01) |
| H01L 25/16 | (2006.01) |
| G02B 6/43 | (2006.01) |

(52) U.S. Cl.
CPC ................ *G02B 6/4202* (2013.01); *G02B 6/43* (2013.01); *H01L 25/0655* (2013.01); *H01L 25/167* (2013.01); *H01L 2924/19104* (2013.01); *H01L 2224/16227* (2013.01); *H01L 2224/48227* (2013.01); *H01L 2224/73207* (2013.01); *H01L 2224/45144* (2013.01); *H01L 2924/3011* (2013.01); *H01L 2224/16225* (2013.01)

(58) Field of Classification Search
None
See application file for complete search history.

(56) References Cited

U.S. PATENT DOCUMENTS 6,477,284 B1   11/2002   Oda et al.
(Continued)

FOREIGN PATENT DOCUMENTS

| JP | 2001-007463 | 1/2001 |
| JP | 2003-060107 | 2/2003 |

(Continued)

OTHER PUBLICATIONS

International Search Report dated Nov. 2, 2009.

*Primary Examiner* — Matthew W Such
*Assistant Examiner* — Abul Kalam
(74) *Attorney, Agent, or Firm* — Dentons US LLP

(57) ABSTRACT

Improvement of signal integrity, a size reduction of a device, and the like are realized. A semiconductor integrated circuit section 11 and an optical wiring section 21 are electrically connected to each other by a connection section 31 provided between a face of the semiconductor integrated circuit section 11 and a face of the optical wiring section 21 facing each other. An electrical wiring 23 is provided in an optical wiring section 21. The electrical wiring 23 of the optical wiring section 21 functions as a global wiring electrically connecting between a plurality of circuit blocks CB provided in the semiconductor integrated circuit section 11.

20 Claims, 21 Drawing Sheets

(56) References Cited

U.S. PATENT DOCUMENTS

| | | | |
|---|---|---|---|
| 7,349,614 B2* | 3/2008 | Doan | 385/131 |
| 2002/0028045 A1* | 3/2002 | Yoshimura et al. | 385/50 |
| 2002/0109074 A1* | 8/2002 | Uchida | 250/214.1 |
| 2006/0029326 A1* | 2/2006 | Ouchi | 385/14 |
| 2006/0072871 A1* | 4/2006 | Uchida | 385/14 |
| 2007/0077018 A1* | 4/2007 | Doan | 385/131 |
| 2008/0131050 A1 | 6/2008 | Yanagisawa | |

FOREIGN PATENT DOCUMENTS

| | | |
|---|---|---|
| JP | 2003-332626 | 11/2003 |
| JP | 2004-012889 | 1/2004 |
| JP | 3870976 | 10/2006 |
| JP | 2008-139465 | 6/2008 |
| WO | 2004/010192 | 1/2004 |
| WO | 2005/071807 | 8/2005 |

* cited by examiner

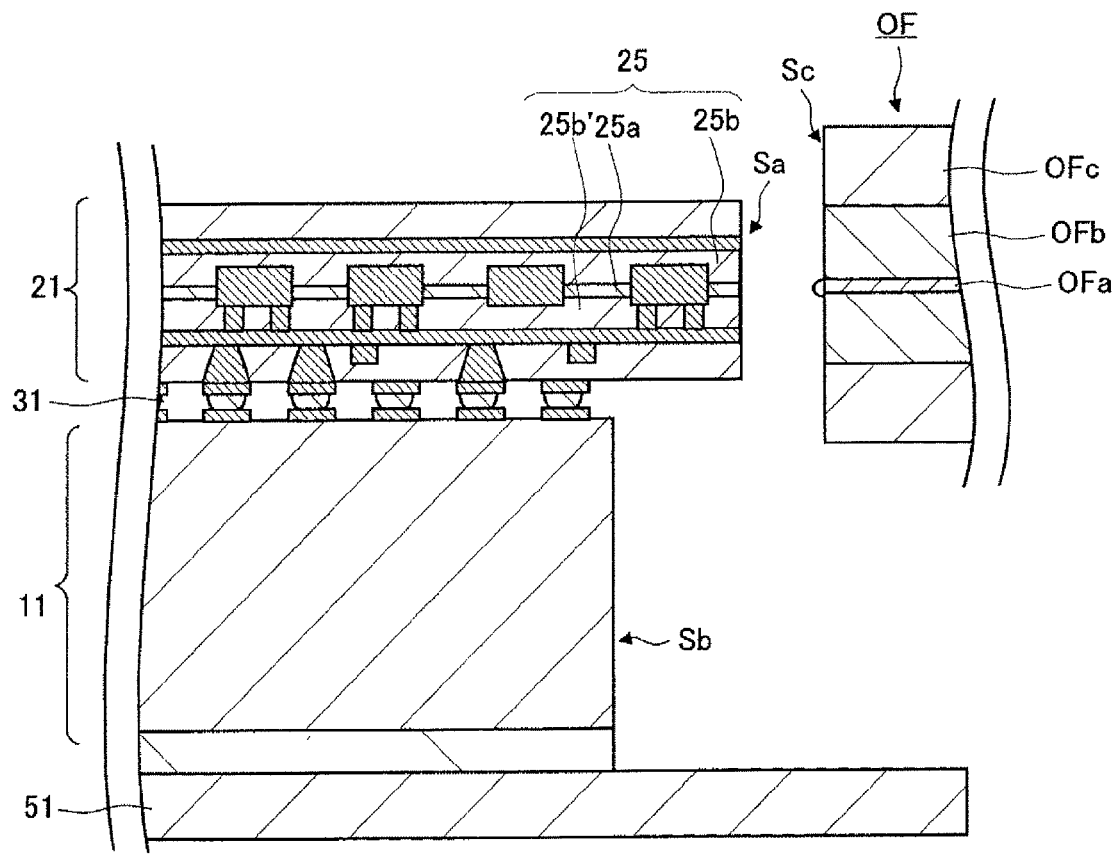
FIG. 6
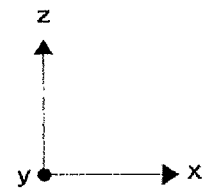

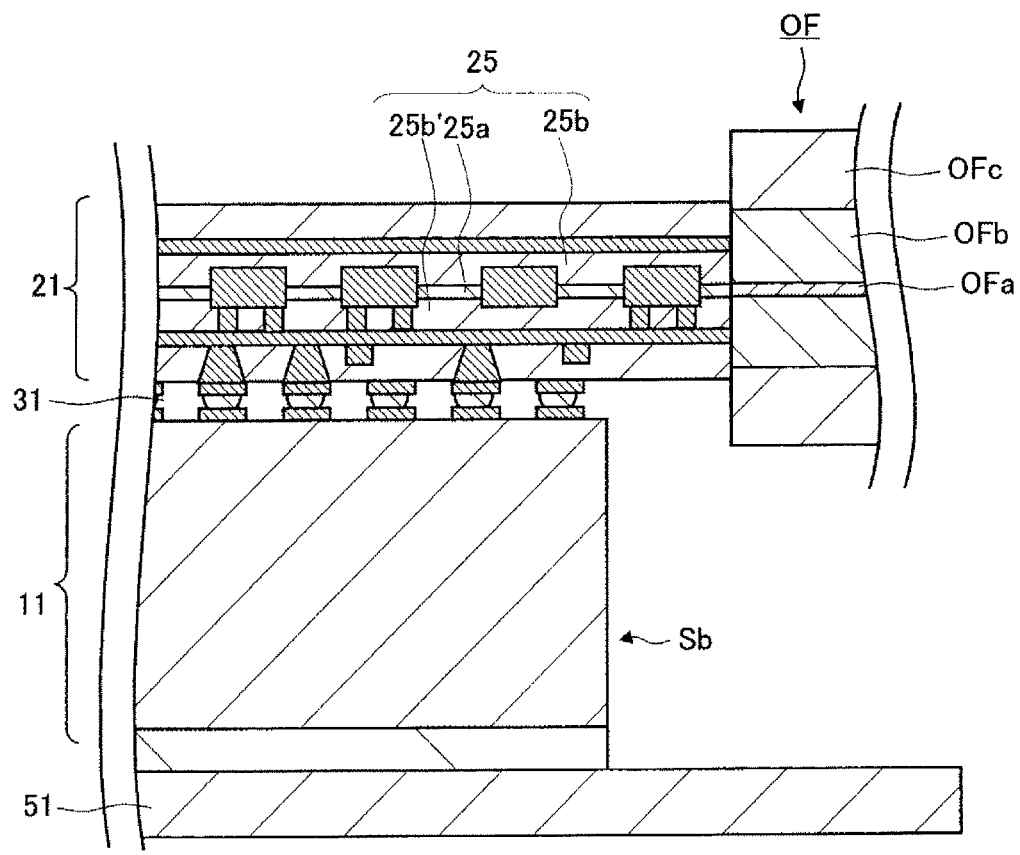
FIG. 7
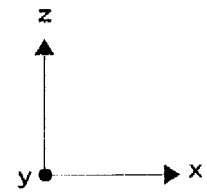

SEMICONDUCTOR DEVICE

TECHNICAL FIELD

The present invention relates to a semiconductor device. In particular, the present invention relates to a semiconductor device in which an optical wiring section is electrically connected to a semiconductor integrated circuit section by a connection section, and the optical wiring section includes an optical waveguide, and an optical active element arranged in the optical waveguide or adjacent to the optical waveguide.

BACKGROUND ART

In a semiconductor integrated circuit, the integration degree has been improved, and miniaturization of a wiring width, and size reduction of an element have been performed. And, accordingly, the amount of processing information is increased, and the number of wirings has been increased and the transmission speed has been increased in signal transmission.

Thus, there is a possibility that deterioration of signal integrity (signal quality) occurs in transmission of an electrical signal.

Specifically, there is a case that a problem such as signal delay, skew between signals, an increase of jitter, or crosstalk between wirings occurs.

In particular, the transmission speed becomes fast, and a frequency band necessary for the signal transmission becomes high, so in an electrical signal, it is necessary to handle a wiring as a distributed constant circuit, from a concentrated constant circuit. Therefore, a problem such as signal reflection due to impedance mismatching, and signal attenuation due to a material has become apparent. Further, in this way, there is a case that radiation of an electromagnetic noise is brought. At the same time, on the contrary, there is a case that influence of the electromagnetic noise is likely to be received.

In addition, to deal with an increase of power consumption accompanied by a leak current and an increase of an operation frequency, an operation voltage of a chip is lowered, and many cores are provided in a chip. Thereby, improvement of the throughput is realized without increasing the operation frequency. However, due to this, the amplitude of a transmission signal is reduced, and, also, a signal transmission distance in the chip tends to be long.

As countermeasures, a differential transmission is applied, a waveform signal is corrected for each wiring, a signal phase is adjusted between wirings, a repeater circuit is inserted in a global wiring to prevent the signal delay, and so on.

Such measures are effective for a certain signal amplitude and a certain wiring length. However, an increase of the number of wirings is brought, and there is a case that an increase of an occupied area of an electrical wiring, an increase of power consumption due to an additional circuit, and an increase of a circuit area are caused. Therefore, the increase of the number of wirings in the signal transmission between the chips highly influences design of the electrical wiring on an interposer substrate and a mother board.

To deal with these problems, it has been proposed that transmission by an optical signal is used for signal transmission in an LSI chip, and between chips (for example, refer to Patent Document 1 and Patent Document 2).

CITATION LIST

Patent Documents

Patent Document 1: International Publication WO 2004/010192
Patent Document 2: Japanese Publication Patent No. 3870976

SUMMARY OF THE INVENTION

However, in the optical signal transmission method in the chip, it is difficult to form an optical waveguide and an optical element at the same time in manufacture of a semiconductor chip in many cases, in consideration of design rules and conformity of used materials. Thus, an increase of manufacturing steps of a chip, and a reduction of a production yield rate are generated, and there is a case that the manufacture efficiency is reduced, and the manufacturing cost is increased. Also, to provide the optical element, an area on which other circuits are provided is reduced, and there is a case that the throughput of the chip is reduced.

In addition, in the optical signal transmission between the chips, it is necessary to provide an opt-electric conversion element and an optical modulation element as separate devices in the vicinity of the chip, and the signal transmission between the opt-electric conversion element and the chip, and between the optical modulation element and the chip is thus performed by an electrical signal. Because the distance of this electrical signal transmission is longer than at least the size of the LSI chip, the above-described problem is generated, and there is a case that the efficiency of the optical signal transmission is lost. Also, design of an electrical wiring on an interposer substrate and a mother board is necessary, the electrical wiring being used for the electrical signal transmission between the opt-electric conversion element and the chip, and between the optical modulation element and the chip. In particular, although superiority of the optical transmission to the electrical transmission is exhibited in the case where the transmission speed is high speed, the design of the above-described electrical transmission line is difficult in this case.

As described above, there is a case that it is difficult to use the optical signal transmission from a viewpoint of manufacture and performance, and it is difficult to sufficiently suppress the deterioration of the signal integrity such as the signal delay, the skew between the signals, the increase of the jitter, and the crosstalk between the wirings.

Also, due to the increase of the wiring length of the global wiring in a high-performance LSI, there is a case that a problem such as a size increase of a global wiring layer, an increase of an RC delay, and an increase of the power consumption accompanied by the size increase of the global wiring layer, and the increase of the RC delay are generated. And, I/O terminals are increased with the high-performance of the LSI chip, and to deal with this, there is a case that the device is increased in size.

In view of the foregoing issues, it is an object of the present invention to provide a semiconductor device capable of preventing a reduction of manufacture efficiency and an increase of a manufacturing cost, and simplifying an electrical wiring design, and capable of easily realizing improvement of a signal integrity, a size reduction of a device, and a reduction of a power consumption.

A semiconductor device according to an embodiment of the present invention includes: a semiconductor integrated circuit section; an optical wiring section arranged to face the semiconductor integrated circuit section, and including an optical waveguide, and an optical active element arranged in the optical waveguide or adjacent to the optical waveguide, and an electrical wiring; and a connection section provided between a face of the optical wiring section and a face of the semiconductor integrated circuit section facing each other, and electrically connecting the optical wiring section and the semiconductor integrated circuit section.

Preferably, the semiconductor integrated circuit section is divided into a plurality of circuit blocks, and the electrical wiring of the optical wiring section is provided as at least a part of a global wiring electrically connecting between the plurality of circuit blocks provided in the semiconductor integrated circuit section.

Preferably, the electrical wiring of the optical wiring section includes at least one of a power source wiring and a ground wiring electrically connected to the semiconductor integrated circuit section.

Preferably, the electrical wiring of the optical wiring section is constituted to transmit at least one electrical signal of a data signal and a clock signal to the semiconductor integrated circuit section.

Preferably, the semiconductor integrated circuit section includes a via wiring provided along a direction in which the semiconductor integrated circuit section and the optical wiring section face each other, and the via wiring electrically connects a semiconductor element provided in the semiconductor integrated circuit section, and the optical wiring section.

Preferably, the optical wiring section includes a via wiring provided along a direction in which the optical wiring section and the semiconductor integrated circuit section face each other, and the via wiring electrically connects the optical active element, the electrical wiring, and the semiconductor integrated circuit section.

Preferably, the optical active element converts an optical signal transmitted by the optical waveguide into an electrical signal, and the converted electrical signal is output to the semiconductor integrated circuit section through the connection section.

Preferably, the optical active element converts an electrical signal transmitted from the semiconductor integrated circuit section through the connection section into an optical signal, and the converted optical signal is transmitted by the optical waveguide.

Preferably, the optical active element is an optical switch element turning on/off light passing through the optical waveguide, and switching an optical path with the electrical signal transmitted from the semiconductor integrated circuit section through the connection section.

Preferably, the electrical wiring is formed along a planar direction in which the optical waveguide extends in the optical wiring section, in a position of a core of the optical waveguide, in a position on a side of the core facing the semiconductor integrated circuit section, or in a position on an opposite side to the side of the core facing the semiconductor integrated circuit section.

Preferably, the optical wiring section further includes an electrical passive element, and the electrical wiring provided in the optical wiring section is electrically connected to the electrical passive element.

Preferably, the connection section electrically connects the semiconductor integrated circuit section and the optical wiring section by using an electrical connection pad provided in the semiconductor integrated circuit section, and an electrical connection pad provided in the optical wiring section. The electrical connection pad provided in the semiconductor integrated circuit section, and the electrical connection pad provided in the optical wiring section are electrically connected by direct connection, or through one of a soldering material, a conductive adhesive material, and an anisotropic conductive adhesive film, in a state of the electrical connection pads as they are, or in a state where a bump is formed on at least one of the electrical connection pads.

Preferably, a light input/output face which light is input to or output from is provided on at least one side face of the optical wiring section, and the light input/output face of the optical wiring section is arranged to protrude more outside than a side face of the semiconductor integrated circuit section.

Preferably, the optical wiring section includes at least one optical path conversion section switching the optical path of the optical waveguide in an opposite direction to a direction in which the optical wiring section faces the semiconductor integrated circuit section, and performing light input to or light output from a face on an opposite side to the direction in which the optical wiring section faces the semiconductor integrated circuit section.

Preferably, a conductive external terminal is provided on one face of the optical wiring section, which is on an opposite side to the face of the optical wiring section facing the semiconductor integrated section.

Preferably, the external terminal is electrically connected to the optical active element, the electrical wiring, or a through hole via formed through the optical wiring section, and directly connected to the connection section.

Preferably, the external terminal is electrically connected to an interposer substrate or a mother board.

Preferably, a number of the semiconductor integrated circuit section is one, a number of the optical wiring section is plural, and the plurality of optical wiring sections are electrically connected to the one semiconductor integrated circuit section.

Preferably, a number of the semiconductor integrated circuit section is plural, a number of the optical wiring section is one, and the plurality of semiconductor integrated circuit sections are electrically connected to the one optical wiring section.

According to the embodiment of the present invention, it is possible to provide the semiconductor device capable of preventing a reduction of a manufacture efficiency and an increase of a manufacturing cost, and simplifying an electrical wiring design, and capable of easily realizing improvement of signal integrity, a size reduction of a device, a reduction of power consumption, and the like.

BRIEF DESCRIPTION OF DRAWINGS

FIG. 6 is a view illustrating the state where an optical fiber is optically coupled to the optical wiring section of the semiconductor device.

FIG. 7 is a view illustrating the state where the optical fiber is optically coupled to the optical wiring section of the semiconductor device.

DESCRIPTION OF EMBODIMENTS

A description of embodiments of the invention will be hereinafter given in detail with reference to the drawings.

<First Embodiment>
[Overall Configuration]

Figure 1:
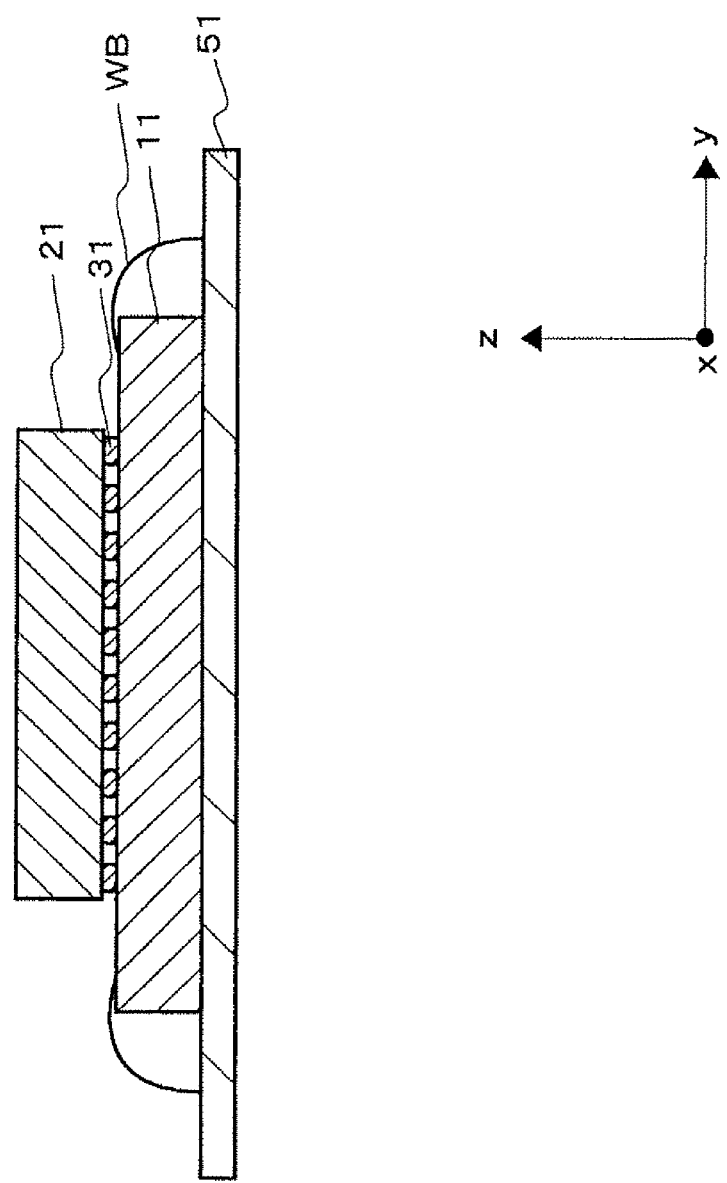
FIG. 1 is a cross-sectional view illustrating a semiconductor device according to a first embodiment of the present invention.
Figure 2:
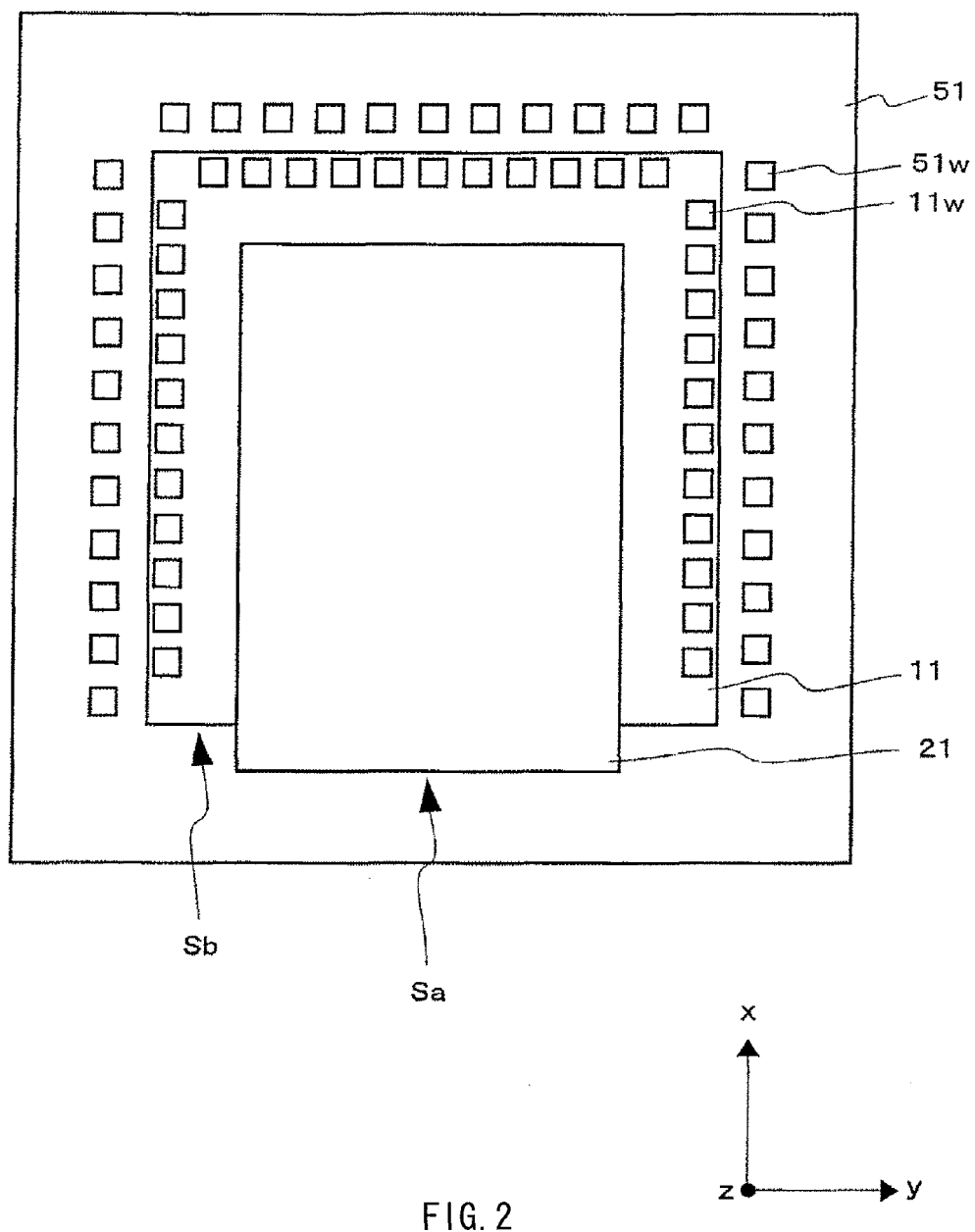
FIG. 2 is a plan view of the semiconductor device of FIG. 1.

FIGS. 1 and 2 illustrate a configuration of a semiconductor device 1 according to a first embodiment of the present invention, FIG. 1 illustrates its cross-sectional structure, and FIG. 2 illustrates its plane configuration.

Figure 3:
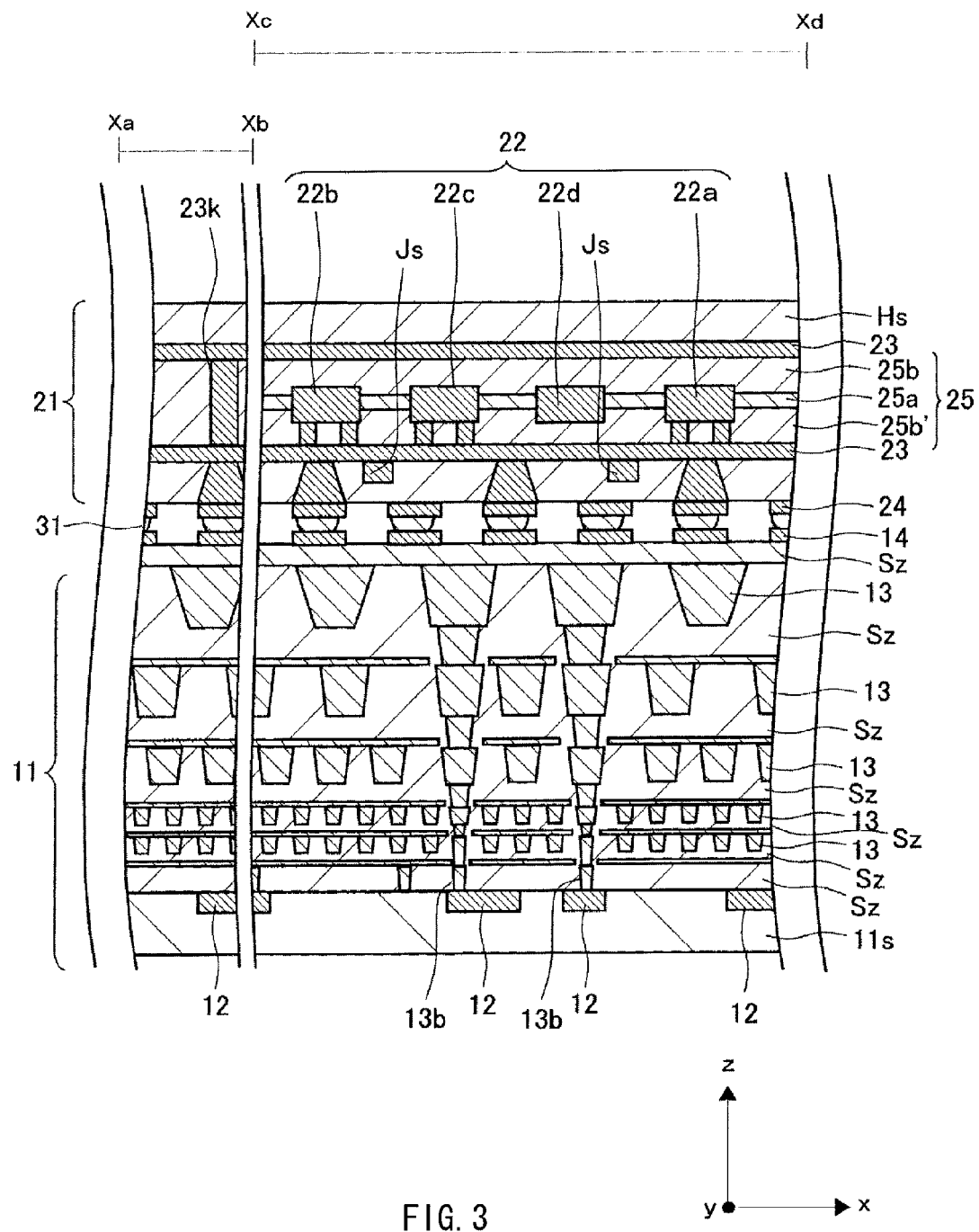
FIG. 3 is a cross-sectional view illustrating a main part of the semiconductor device of FIG. 1 in an enlarged manner.
Figure 4:
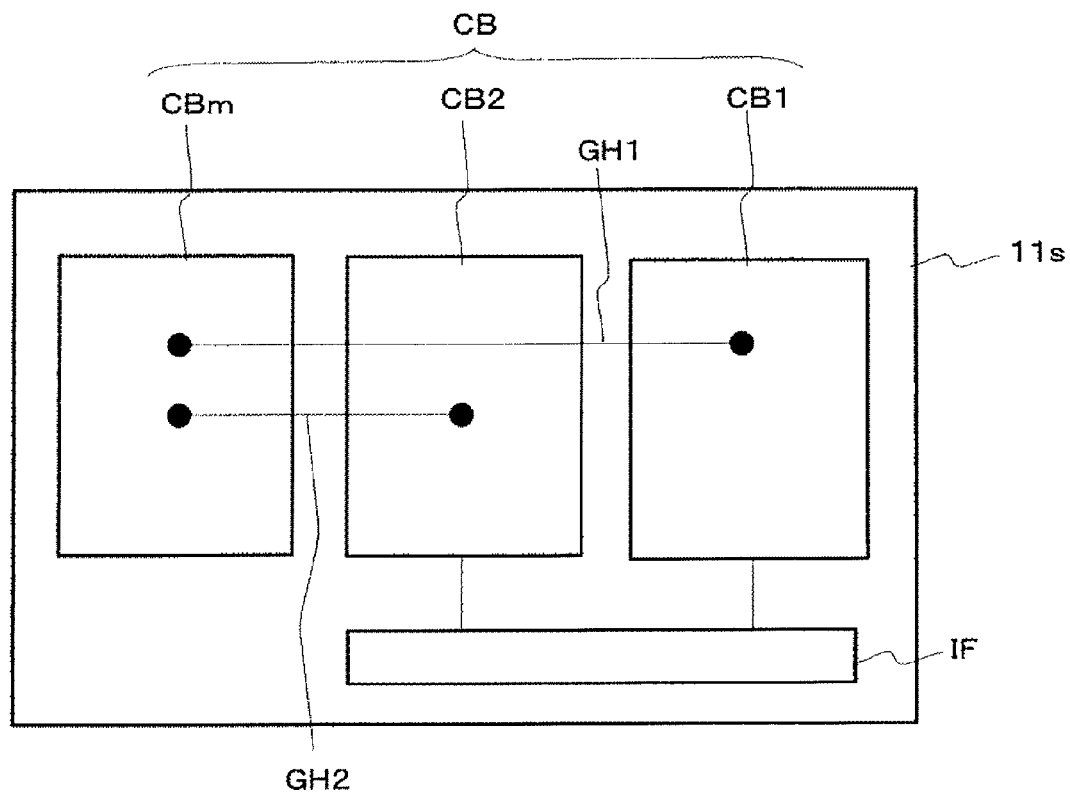
FIG. 4 is a block diagram illustrating a circuit configuration of a semiconductor integrated circuit section.

FIG. 3 illustrates a cross-sectional configuration of a main part of the semiconductor device 1 in an enlarged manner, and, here, illustrates a cross section of an Xa-Xb part, and a cross section of an Xc-Xd part different from the Xa-Xb part. FIG. 4 illustrates a circuit configuration of the semiconductor device 1.

The semiconductor device 1 includes a semiconductor integrated circuit section 11, an optical wiring section 21, and a connection section 31.

Also, as illustrated in FIG. 4, the semiconductor device 1 includes a plurality of circuit blocks CB. The circuit block CB is constituted of, for example, a memory circuit CBm, a first calculation circuit CB1, and a second calculation circuit CB2. Although a detailed description will be given later, each of the memory circuit CBm, the first calculation circuit CB1, and the second calculation circuit CB2 is arranged on a face of a substrate 11s of the semiconductor integrated circuit section 11. As illustrated in FIG. 4, an input/output interface IF is provided in the semiconductor device 1. The input/output interface IF is, for example, electrically connected to each of the first calculation circuit CB1 and the second calculation circuit CB2, and performs an input/output of a signal.

The structure between the memory circuit CBm and the first calculation circuit CB1, and the structure between the memory circuit CBm and the second calculation circuit CB2 are formed so that signal transmission is performed by using so-called global wirings GH1 and GH2.

In this embodiment, the optical wiring section 21 is constituted to include functions of the global wirings GH1 and GH2, and is constituted so that signal transmission between each of the circuit blocks CB is performed through the optical wiring section 21.

For example, the semiconductor device 1 is configured so that the signal transmission between the memory circuit CBm and the first calculation circuit CB1 is performed by transmitting an optical signal in an optical waveguide 25 of the optical wiring section 21. That is, the optical waveguide 25 of the optical wiring section 21 is provided as the global wiring GH1.

Also, the semiconductor device 1 is configured so that the signal transmission between the memory circuit CBm and the second calculation circuit CB2 is performed by using an electrical wiring 23 of the optical wiring section 21. That is, at least a part of the electrical wiring 23 of the optical wiring section 21 is provided as the global wiring GH2.

[Structure of Each Section]

Next, the semiconductor integrated circuit section 11 will be described.

As illustrated in FIG. 1, the semiconductor integrated circuit section 11 is arranged to face the optical wiring section 21. The connection section 31 is provided on a top face side of the semiconductor integrated circuit section 11 facing the optical wiring section 21, and the semiconductor integrated circuit section 11 is electrically connected to the optical wiring section 21 through the connection section 31.

An interposer substrate 51 is arranged on a bottom face of the semiconductor integrated circuit section 11, which is on the opposite side to the top face of the semiconductor integrated circuit section 11 facing the optical wiring section 21, and the semiconductor integrated circuit section 11 and the interposer substrate 51 are electrically connected by a wire bonding WB. The semiconductor integrated circuit section 11 is, for example, mounted on the interposer substrate 51 by using DAF (die attachment film).

As illustrated in FIG. 2, the planar shape of the semiconductor integrated circuit section 11 is a rectangle shape, and a plurality of electrical connection pads $11w$ for wire bonding are provided in a vicinity portion of the semiconductor integrated circuit section 11. As illustrated in FIG. 1, the electrical connection pad $11w$ is electrically connected to an electrical connection pad $51w$ of the interposer substrate 51 by the wire bonding WB.

The electrical connection pads $11w$ and $51w$ are, for example, an aluminum alloy pad of 5 to 90 μm square size, but may be formed by using a pure aluminum instead of that.

In these electrical connection pads $11w$ and $51w$, for example, an UBM (under barrier metal) bump (not illustrated in the figure) of Ni/Pd/Au is formed. The UBM bump is formed by zinc substitution, elecroless Pd plating, and electroless Au plating, for example, to have a thickness of approximately 7 μm in Ni, a thickness of approximately 0.05 μm in Pd, and a thickness of approximately 0.05 μm in Au. Here, it is preferable to form the UBM bump to have a thickness of 2 μm or larger in Ni, a thickness of approximately 0.05 μm or larger in Pd, and a thickness of approximately 0.05 to 0.4 μm in Au.

In addition, in the case where a soldering material mainly containing Sn is used in bonding with the optical wiring section 21, Sn forms an alloy with Au of the UBM bump after the bonding, and there is a case that the bonding strength is reduced. Thus, it is not preferable to make the thickness of Au large. However, in the wire bonding WB, Au wire bonding is appropriately formed on the contrary, so it is preferable for Au to have a large thickness to a certain degree. Therefore, for example, it is preferable to form Au in a thickness of approximately 0.1 μm.

The wire bonding WB described above may be used to bond a mother board, instead of the interposer substrate 51.

As illustrated in FIG. 3, in this embodiment, the semiconductor integrated circuit section 11 includes a semiconductor element 12 and an electrical wiring 13.

As illustrated in FIG. 3, the plurality of semiconductor elements 12 of the semiconductor integrated circuit section 11 are provided on a main face of the semiconductor substrate 11s formed of silicon. The semiconductor element 12 constitutes the circuit block CB described above (FIG. 4), processes an input electrical signal, and output the processed electrical signal.

As illustrated in FIG. 3, the plurality of electrical wirings 13 of the semiconductor integrated circuit section 11 are provided on the main face of the semiconductor substrate 11s. The electrical wiring 13 has a multilayer wiring structure, and is electrically connected to the semiconductor element 12. That is, a plurality of interlayer insulating films Sz are stacked on the face of the semiconductor substrate 11s, and the electrical wiring 13 is provided in each of the plurality of interlayer insulating films Sz.

The electrical wiring 13 is formed of a conductive material, and an electrical signal input to the semiconductor element 12 is transmitted by the electrical wiring 13. Also, the electrical wiring 13 transmits an electrical signal processed in and output from the semiconductor element 12. In other words, the electrical signal processed in the semiconductor element 12 is transmitted to the optical wiring section 21 through the connection section 31 by the electrical wiring 13.

In this embodiment, as illustrated in FIG. 3, the electrical wiring 13 is formed to include a via wiring 13b.

As illustrated in FIG. 3, the via wiring 13b is formed through each interlayer insulating film Sz, and is provided along a z direction in which the semiconductor integrated circuit section 11 and the optical wiring section 21 face each other. Here, the plurality of via wirings 13b are stacked in the z direction. And, the plurality of via wirings 13b electrically connect the semiconductor element 12 and the optical wiring section 21. In other words, the plurality of via wrings 13b are provided immediately above the semiconductor element 12 so that the semiconductor element 12 is electrically connected to the optical wiring section 21. In addition, here, the position of the via wiring 13b may be slightly shifted from immediately above the semiconductor element 12 to avoid stress directly applied to the semiconductor element 12.

As illustrated in FIG. 3, in the semiconductor integrated circuit section 11, a plurality of electrical connection pads 14 are provided on the top face of the semiconductor integrated circuit section 11 facing the optical wiring section 21. The electrical connection pad 14 is formed of a conductive material, and is electrically connected to the optical wiring section 21 through the connection section 31.

Next, the optical wiring section 21 will be described.

As illustrated in FIG. 1, the optical wiring section 21 is arranged to face the semiconductor integrated circuit section 11. The connection section 31 is provided on a face side of the optical wiring section 21 facing the semiconductor integrated circuit 11, and the optical wiring section 21 is electrically connected to the semiconductor integrated circuit section 11 through the connection section 31. Like the semiconductor integrated circuit section 11, the optical wiring section 21 is formed of a silicon-based material, and the thermal expansion coefficient of the optical wiring section 21 is the same as that of the semiconductor integrated circuit section 11. Thus, it is not necessary to fill up with an underfiller after the optical wiring section 21 and the semiconductor integrated circuit section 11 are bonded.

As illustrated in FIG. 2, a light input/output face Sa which light such as an optical signal is input to or output from is provided on a side face of the optical wiring section 21. The light input/output face Sa is arranged to protrude more outside than a side face Sb of the semiconductor integrated circuit section 11. The planar shape of the optical wiring section 21 is a rectangle shape.

As illustrated in FIG. 3, the optical wiring section 21 includes the optical element 22, the electrical wiring 23, and the optical waveguide 25, and performs at least a part of the signal transmission in the semiconductor integrated circuit section 11 by transmitting the optical signal in the optical waveguide 25.

As illustrated in FIG. 3, the optical waveguide 25 of the optical wiring section 21 includes a core 25a, and clads 25b and 25b'.

As illustrated in FIG. 3, the core 25a is formed to extend in an x direction, and performs a transmission of the optical signal. In addition, although not illustrated in FIG. 3, the direction in which the core 25a extends may be any direction as long as it is within an xy plane.

Also, the clads 25b and 25b' are provided in the surrounding of the core 25a extending in the x direction. These clads 25b and 25b' are formed by using a material with a refractive index lower than that of a material of the core 25a. Thus, in the clads 25b and 25b', light is confined in the core 25a, and it is possible to transmit the light in the extending direction of the core 25a.

In this embodiment, the optical element 22 is incorporated in the optical waveguide 25, and the optical signal is input from the core 25a to the optical element 22. Further, the optical signal is output from the optical element 22 to the core 25a.

As illustrated in FIG. 3, the plurality of electrical wirings 23 of the optical wiring section 21 are formed to sandwich the optical waveguide 25 in the z direction. Here, like the optical waveguide 25 extending in the x direction, the electrical wiring 23 is formed to extend in the x direction on the xy plane of the optical waveguide 25. A face of the electrical wiring 23, which is on the opposite side to the optical waveguide 25 side, is covered with a protective layer Hs of an insulating material. That is, the electrical wiring 23 is formed on a face side of the core 25a facing the semiconductor integrated circuit section 11, and on an opposite side to the side of the core 25a facing the semiconductor integrated circuit section 11. In addition, although not illustrated in FIG. 3, the electrical wiring 23 may extend in any direction as long as it is within the xy palne. Also, the electrical wiring 23 may be provided in a height position of the core 25a as long as it does not intersect the core 25a of the optical waveguide 25.

The electrical wiring 23 is formed of a conductive material, and is electrically connected to an electrical connection pad 24. Here, the electrical wiring 23 is electrically connected to the connection section 31 through the electrical connection pad 24, and transmits an electrical signal converted by an opt-electric conversion element 22a to the semiconductor integrated circuit section 11 through the connection section 31.

A via wiring 23k is provided between the plurality of electrical wirings 23. The via wiring 23k is formed of a conductive material along the z direction in which the optical wiring section 21 and the semiconductor integrated circuit section 11 face each other, and is electrically connected to both of the electrical wirings 23. Also, the via wiring 23k electrically connects the optical element 22, the electrical wiring 23, and the semiconductor integrated circuit section 11. As illustrated in FIG. 3, the via wiring 23k is a portion other than the core 25a in the optical waveguide 25, and is formed to connect between both faces of the optical wiring section 21. Here, the via wiring 23k is formed through the optical waveguide 25 in the z direction vertical to the x direction in which the optical waveguide 25 extends.

In addition, although detail will be described later, the electrical wiring 23 is formed as a wiring supplying electricity from a power source to the semiconductor integrated circuit section 11, or a ground (GND) wiring. Also, in addition to this, the electrical wiring 23 can be appropriately utilized to transmit an electrical signal such as a data signal and a clock signal. Also, the via wiring 23k may be constituted to be directly connected to the connection section 31.

As illustrated in FIG. 3, the optical element 22 of the optical wiring section 21 includes, for example, an optical active element such as the opt-electric conversion element 22a, the electro-optical conversion element 22b, and an optical switch element 22c, and each section is incorporated in the optical waveguide 25. As illustrated in FIG. 3, each of the elements 22a, 22b, and 22c is electrically connected to the electrical wiring 23 positioned below the optical waveguide 25. In addition, connection terminals of each of the elements 22a, 22b, and 22c are electrically separated from each other, although they look overlapping because FIG. 3 is a cross-sectional view (refer to FIG. 5, which will be described later).

The opt-electric conversion element 22a is, for example, a (normal type) photodiode or a plasmon antenna type photodiode, and converts the optical signal transmitted by the optical waveguide 25 into an electrical signal. The electrical signal converted by the opt-electric conversion element 22a is output to the semiconductor integrated circuit section 11 through the connection section 31.

The electro-optical conversion element 22b is, for example, a laser diode, a Mach-Zehnder type optical conversion element, or a PN diode type optical convertor, and converts an electrical signal into an optical signal. In this embodiment, for example, the electro-optical conversion element 22b converts, for example, an electrical signal input from the semiconductor integrated circuit section 11 through the connection section 31 into an optical signal. The optical signal converted by the electro-optical conversion element 22b is transmitted in the optical waveguide 25.

The optical switch element 22c is configured to turn on/off light passing through the optical waveguide 25, and switch an optical path with the electrical signal transmitted from the semiconductor integrated circuit section 11 through the connection section 31. The optical switch element 22c is an optical gate switch element, an optical path switch element, or the like, and an element utilizing an thermooptic effect, an electrooptic effect, and a magnetooptic effect can be used as the optical switch element.

As illustrated in FIG. 3, an optical passive element 22d which does not have an electrical connection is provided as the optical element 22.

Also, in addition to the above, the following may be provided as the optical element 22.

They are a wavelength conversion element, an optical branch unit, an optical multiplexer/demultiplexer, an optical attenuation element, a wavelength selection element, an optical scattering element, a grating coupler, a ring resonator type filter, a multimode interference type optical coupler, an optical path conversion element, and a spot size conversion element.

Also, in addition to this, as illustrated in FIG. 3, an electrical passive element Js is provided in the optical wiring section 21. For example, a condenser, an inductor, a resistance element, or the like is provided as the electrical passive element Js, and the electrical passive element Js is electrically connected to the electric wiring 23. Thereby, removal of an electrical noise, prevention of a voltage fluctuation and a current fluctuation, adjustment of a wiring impedance, termination of a wiring, passage or bypass of a specific frequency component, and decoupling are performed. The electrical passive element Js may be provided by burying a chip component. Also, in addition to this, the electrical passive element Js may be mounted in a form of CoP (Chip on Parts).

As illustrated in FIG. 3, the plurality of electrical connection pads 24 are provided on the bottom face of the optical wiring section 21 facing the semiconductor integrated circuit section 11. The electrical connection pad 24 is formed of a conductive material. The plurality of electrical connection pads 24 are electrically connected to the electrical connection pads 14 of the semiconductor integrated circuit section 11 through the connection section 31.

Next, an example of the optical wiring section 21 will be described in detail.

Figure 5:
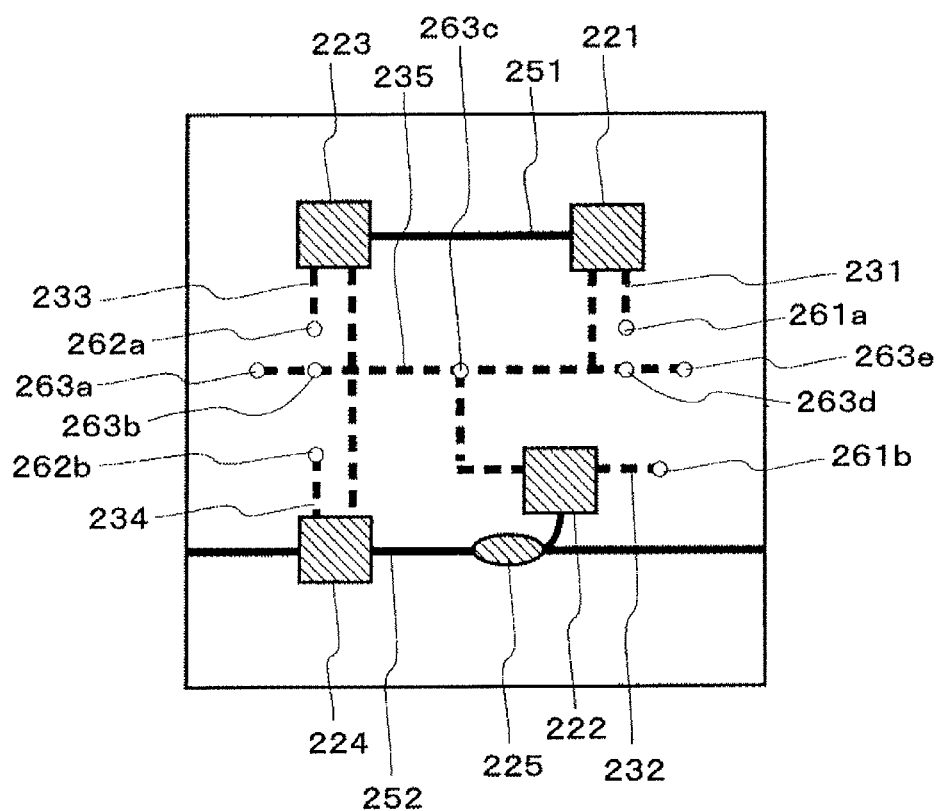
FIG. 5 is a plan view schematically illustrating an example of an optical wiring section.

FIG. 5 schematically illustrates the example of the optical wiring section 21.

Optical waveguides 251 and 252 are provided as an example of the optical waveguide 25 described above in the optical wiring section 21.

Also, electrical wirings 231, 232, 233, 234, and 235 are provided as an example of the electrical wiring 23 in the optical wiring section 21. Although detail will be described later, the electrical wirings 231 and 232 transmit an output signal, and the electrical wirings 233 and 234 transmit an input signal. The electrical wiring 235 functions as a GND line.

Via wirings 261a, 261b, 262a, 262b, and 263a to e are provided as an example of the via wiring 23k in the optical wiring section 21. Although detail will be described later, the via wirings 261a and 261b transmit an ouput signal, and the via wirings 262a and 262b transmit an input signal. The via wirings 263a to e function as a GND line.

Also, opt-electric conversion elements 221 and 222 are provided as an example of the opt-electric conversion element 22a in the optical wiring section 21. Each of the opt-electric conversion elements 221 and 222 is, for example, an optical receiver such as a photodiode.

Electro-optical conversion elements 223 and 224 are provided as an example of the electro-optical conversion element 22b in the optical wiring section 21. The electro-optical conversion element 223 is, for example, a light source such as a diode laser, and the electro-optical conversion element 224 is, for example, a Mach-Zehnder type optical modulator.

Further, an optical branch element 225 is provided as an example of the optical passive element 22d in the optical wiring section 21. The optical branch element 225 is, for example, an optical branch unit such as a ring resonator type filter. In addition to that, a multimode interference type optical coupler, an optical multiplexer/demultiplexer, or the like can be provided as the optical passive element 22d.

Next, an upper part of FIG. 5 will be described.

In the upper part of FIG. 5, the optical waveguide 251 extends in the x direction to intervene between the opt-electric conversion element 221 and the electro-optical conversion element 223 in the xy plane of the optical wiring section 21. The optical waveguide 251 optically connects the opt-electric conversion element 221 and the electro-optical conversion element 223. In the electro-optical conversion element 221, one end is electrically connected to the via wiring 261a through the electric wiring 231, and the other end is electrically connected to the via wirings 263a to 263e through the electric wiring 235. In the electro-optical conversion element 223, one end is electrically connected to the via wiring 262a through the electric wiring 233, and the other end is electrically connected to the via wirings 263a to 263e through the electric wiring 235.

Operation of FIG. 5 is as will be described below. First, the electrical signal is input from the via wiring 262a to the electro-optical conversion element 223 through the electric wiring 233, and is converted into an optical signal by the electro-optical conversion element 223. The optical signal converted by the electro-optical conversion element 223 is transmitted by the optical waveguide 251 to be input to the opt-electric conversion element 221, and converted into an electrical signal by the opt-electric conversion element 221. The electrical signal is output to the via wiring 261 through the electric wiring 231. In this manner, in the upper part of FIG. 5, the optical waveguide 251 is constituted to perform transmission of light in the inside of the optical wiring section 21.

Next, a lower part of FIG. 5 will be described.

In the lower part of FIG. 5, the optical waveguide 252 includes a portion extending in the x direction between a left end part and a right end part of the optical wiring section 21, and is constituted so that light input from outside to the left end part is output outside from the right end part. The electro-optical conversion element 224 and the optical branch element 225 are provided in the portion of the optical waveguide 252 extending in the x direction. The optical waveguide 252 includes a portion transmitting the light in a direction different from the x direction. One end of this portion is optically connected to the optical branch element 225, and the other end is optically connected to the opt-electric conversion element 222. In the opt-electric conversion element 222, one end is electrically connected to the via wiring 261a through the electric wiring 232, and the other end is electrically connected to the via wirings 263a to 263e through the electric wiring 235. In the electro-optical conversion element 224, one end is electrically connected to the via wiring 262b through the electric wiring 234, and the other end is electrically connected to the via wirings 263a to 263e through the electric wiring 235.

Operation of the lower part of FIG. 5 is as will be described below. First, the light is input from outside to the left end part of the optical waveguide 252, and that light is input to the electro-optical conversion element 224. In the electro-optical conversion element 224, the light is modulated based on the electrical signal input from the via wiring 262 through the electric wiring 234. The modulated light is transmitted by the optical waveguide 252, input to the optical branch element 225, and branched by the optical branch element 225. Here, a part of the light branched by the optical branch element 225 is transmitted to the opt-electric conversion element 222. A part of the remaining light branched by the optical branch element 225 is output outside from the right end part of the optical waveguide 252.

Next, the connection section 31 will be described.

As illustrated in FIG. 1, the connection section 31 is provided between a face of the optical wiring section 21 and a face of the semiconductor integrated circuit section 11 facing each other. The connection section 31 is formed of a conductive material, and electrically connects the optical wiring section 21 and the semiconductor integrated circuit section 11. For example, the connection section 31 is a solder bump, and intervenes between the electrical connection pad 24 provided on the top face of the optical wiring section 21, and the electrical connection pad 14 of the semiconductor integrated circuit section 11.

In this embodiment, the connection section 31 is, for example, formed by bonding a solder bump provided in the electrical connection pad 24 of the optical wiring section 21 to the electric connection pad 14 of the semiconductor integrated circuit section 11. Thereby, a firstly mounting in which the optical wiring section 21 is mounted on the semiconductor integrated circuit section 11 is performed. That is, after each of the optical wiring section 21 and the semiconductor integrated circuit section 11 is separately formed, the mounting is performed so that the connection section 31 electrically connects both of the optical wiring section 21 and the semiconductor integrated circuit section 11, thereby forming the semiconductor device 1.

As the solder bump, for example, a AuSn bump is used. For example, the AuSn bump is formed by adjusting plating conditions to Au: Sn=80wt %:20wt %. In addition to this, like a Sn—Ag—Cu based material or the like, a soldering material containing Sn as a main component can be used. However, in this case, because flux is necessary to remove an oxidized film of Sn, necessity of washing to remove the flux is generated after the bonding. It is possible to perform the above-mentioned firstly mounting by using a flip-chip bonder.

FIGS. 6 and 7 illustrate the state where an optical fiber OF is optically coupled to the optical wiring section 21 of the semiconductor device 1.

First, as illustrated in FIG. 6, the optical fiber OF is aligned in position with the optical wiring section 21.

Here, a light input/output face Sc of the optical fiber OF, which light is input from or output to, is faced to the light input/output face Sa of the optical wiring section 21, which light such as an optical signal is input from or output to.

Specifically, the optical fiber OF including a core OFa, a clad OFb, and a cover OFc is prepared. Here, the optical fiber OF in which the clad OFb is provided in the surrounding of the core OFa, and the cover OFc is provided in the surrounding of the clad OFb is prepared.

After that, the optical fiber OF is aligned in position with the optical wiring section 21 so that a portion of the light input/output face Sa provided with the core 25a, and a portion of the light input/output face Sc provided with the core OFa face each other.

Next, as illustrated in FIG. 7, the optical fiber OF is optically coupled to the optical wiring section 21.

Here, the optical fiber OF is moved to the optical wiring section 21 so that the light input/output face Sc is in contact with the light input/output face Sa.

Subsequently, the portion of the light input/output face Sa in the optical wiring section 21 provided with the core 25a, and the portion of the light input/output face Sc in the optical fiber OF provided with the core OFa are optically coupled. In addition, the optical fiber may be a single mode fiber, and the core diameter of the fiber is approximately 10 μm in the case of a wavelength of 1550 nm (approximately 5 μm for a wavelength of 780 nm). In the case where the core diameter of the optical waveguide is smaller than the core diameter of the optical fiber, a spot size conversion section is typically provided in the vicinity of the end portion of the optical wavelength, for improvement of the optical coupling efficiency.

As described above, in this embodiment, each of the semiconductor integrated circuit section 11 and the optical wiring section 21 is electrically connected by the connection section 31 provided between the face of the semiconductor integrated circuit section 11 and the face of the optical wiring section 21 facing each other. Further, the electric wiring 23 is provided in the optical wiring section 21. The electrical wiring 23 of the optical wiring section 21 is provided to function as at least a part of the global wiring electrically connecting between the plurality of circuit blocks CB provided in the semiconductor integrated circuit section 11.

In this manner, in this embodiment, the electrical wiring 23 functioning as the global wiring is formed in the optical wiring section 21, while an electrical wiring functioning as the global wiring is not formed on the semiconductor integrated circuit section 11 side. Thus, in this embodiment, it is possible to avoide problems such as a size increase of a global wiring layer, an increase of an RC delay, and an increase of power consumption accompanied by the size increase of the global wiring layer, and the increase of the RC delay. In particular, in the case of an optical transmission, a wavelength multiplexing transmission, which is not possible in the electric transmission, is possible, and in the case where this is used, it is possible to highly contribute to size reduction of wiring layers, and size reduction of the chip. Also, thereby, this leads to reduction of used members, reduction of processes, and improvement of a yield rate in manufacture of the chip. Further, herewith, in this embodiment, it is possible to easily deal with a high-speed transmission, and deal with stabilization of power source supply. And, an element which has been difficult to be manufactured due to restrictions of processes and design rules in the semiconductor integrated circuit section 11 can be easily manufactured in the optical wiring section 21, so it is possible to easily realize improvement of characteristics by this embodiment.

More specifically, in this embodiment, it is possible to exhibit the following effects.

(1) The semiconductor integrated circuit section 11 and the optical wiring section 21 are separately constituted, and it is easy to form the optical wiring section 21. Also, the semiconductor integrated circuit section 11 and the optical wiring section 21 are connected only by electrical connection, and the connection is thus easily performed. Therefore, it is possible to easily realize the optical transmission of the semiconductor integrated circuit section 11.

(2) A global wiring process can be reduced or can be deleted from a manufacture process of the semiconductor integrated circuit section 11 by providing the global wiring in the optical wiring section 21. Therefore, it is possible to reduce the manufacturing cost, and shorten a manufacturing time.

(3) Design rules of the global wiring are not influenced by design rules on the semiconductor integrated circuit section 11 side, so a more appropriate design is possible. For example, it is not possible to form a wiring having a large cross-sectional area on the semiconductor integrated circuit section 11 because stress distortion or the like is directly carried to a fine semiconductor element, but it is possible to form this wiring on the optical wiring section 21.

(4) The layout of the global wiring is unlikely to be restricted by arrangement on the semiconductor integrated circuit section 11 side, so a more appropriate design is possible.

(5) The electrical passive element is easily formed together with the global wiring, and it is possible to improve the transmission quality.

In addition, when the electrical wiring 23 of the optical wiring section 21 is used as the global wiring as in this embodiment, it is possible to more preferably exhibit the above-described effects in the following cases:

(a) Case where a relatively-short distance transmission such as a transmission between the circuit blocks CB adjacent to each other is performed;

(b) Case where it is difficult to form an optical transmission section in design;

(c) Case where it is necessary to transmit or supply a specific voltage, a specific current, or a specific electric power; and (d) Case where the transmission speed is low.

Also, in this embodiment, the light input/output face Sa in which light such as an optical signal is input to or output from is provided on the side face of the optical wiring section 21, and the light input/output face Sa of the optical wiring section 21 is arranged to protrude more outside than the side face Sb of the semiconductor integrated circuit section 11. Thus, in this embodiment, as illustrated in FIGS. 6 and 7, it is possible to easily align the optical fiber OF with the optical wiring section 21 in position, and it is possible to accurately perform optical coupling between the both. Also, in this embodiment, when an underfiller material or the like is used in the mounting, the underfiller material or the like does not get wet on the light input/output face Sa, and, also, a fillet formed of the underfiller material or the like, and the optical fiber OF are not interfered. Thus, it is possible to realize stable optical coupling.

Also, in this embodiment, in the semiconductor integrated circuit section 11, the semiconductor element 12 is formed on the face of the semiconductor substrate 11s, and the electrical wiring 13 electrically connected to the semiconductor element 12 is formed on the face of the semiconductor substrate 11s. In the electrical wiring 13, the via wiring 13b is provided along the z direction in which the semiconductor integrated circuit section 11 and the optical wiring section 21 face each other. The via wiring 13b electrically connects the semiconductor element and the optical wiring section. That is, the via wiring 13b is electrically connected to the optical wiring section 21 immediately above the semiconductor element 12. Thus, in this embodiment, the distance from the semiconductor element 12 to the optical wiring section 21 is short, so it is possible to preferably realize high-speed transmission.

Also, in this embodiment, the optical wiring section 21 includes the opt-electric conversion element 22a converting an optical signal transmitted by the optical waveguide 25 into an electrical signal, and the electrical signal converted by the opt-electric conversion element 22a is output to the semiconductor integrated circuit section 11 through the connection section 31. Also, the optical wiring section 21 includes the first electro-optical conversion element 22b converting an electrical signal into an optical signal, and the optical signal converted by the electro-optical conversion element 22b is transmitted by the optical waveguide 25.

In this embodiment, the electro-optical conversion element 22b converts the electrical signal into the optical signal, and the opt-electric conversion element 22a converts the optical signal converted by the electro-optical conversion element 22b and transmitted by the optical waveguide 25 into the electrical signal. Here, the electrical signal input from the semiconductor integrated circuit section 11 through the connection section 31 is converted into the optical signal by the electro-optical conversion element 22b, and the optical signal transmitted by the optical waveguide 25 is converted into the electrical signal by the opt-electric conversion element 22a. That electrical signal is output to the semiconductor integrated circuit section 11 through the connection section 31. Thus, in this embodiment, the electrical signal is converted into the optical signal, and it is possible to perform clock distribution and data transfer. Therefore, it is possible to realize high-speed data transmission in the transmission line for the clock distribution and between the circuit blocks in the semiconductor integrated circuit section 11.

Also, in this embodiment, the electrical wiring 23 of the optical wiring section 21 is formed on the optical waveguide 25 or in the optical waveguide 25. Here, the optical waveguide 25 is formed by using the electrically insulating material. In this manner, in this embodiment, the electric wiring 23 is formed by utilizing the optical waveguide 25 as the interlayer insulating film. Thus, in this embodiment, it is possible to reduce the manufacture processes, and it is possible to realize efficient manufacture. Also, in this embodiment, the global wiring and the optical wiring section 21 can be formed at the same time, and it is possible to reduce the manufacturing cost and shorten the manufacturing time.

In addition, a part of the global wiring section can also be formed in the semiconductor integrated circuit according to needs.

<Second Embodiment>

Figure 8:
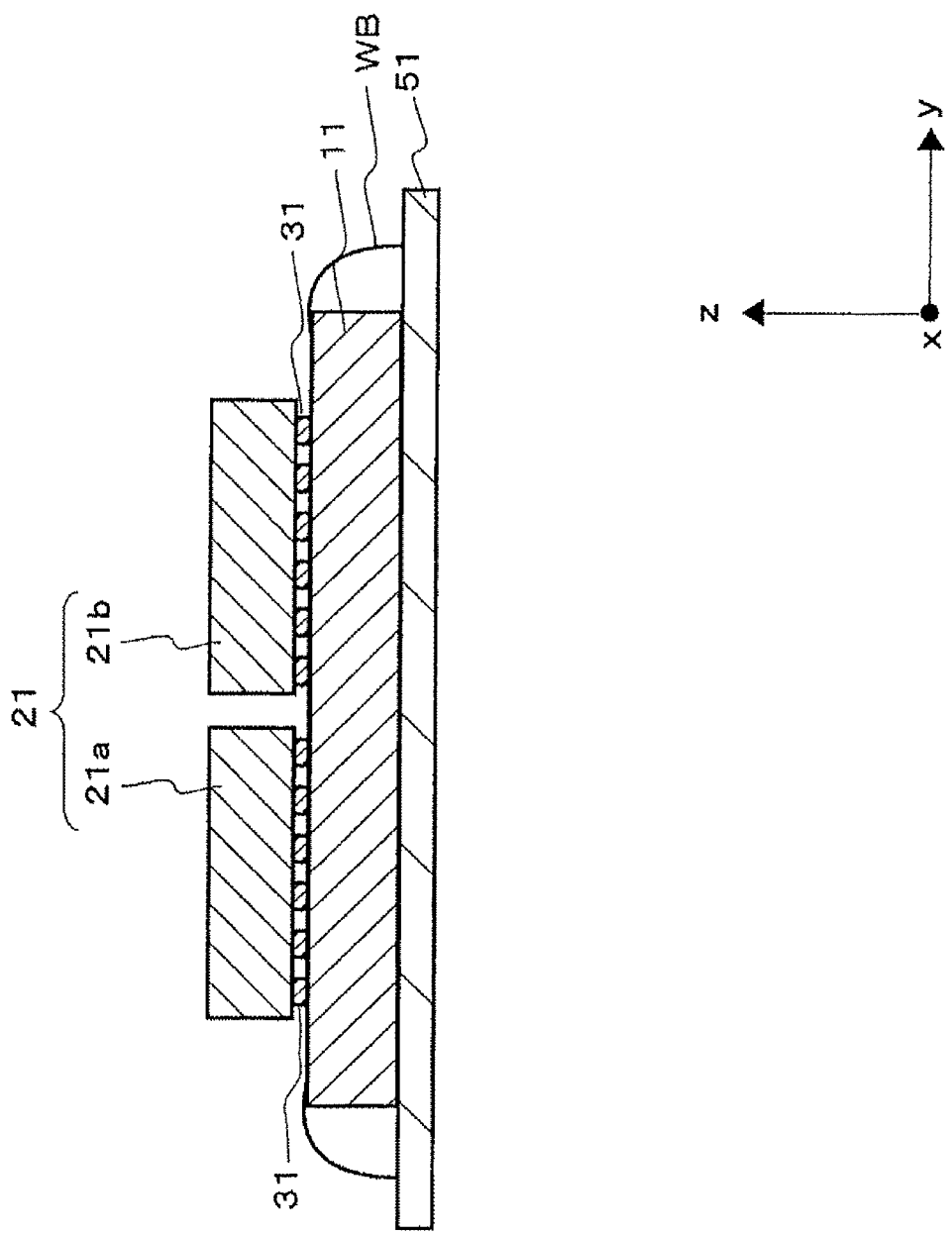
FIG. 8 is a cross-sectional view illustrating the semiconductor device according to a second embodiment of the present invention.
Figure 9:
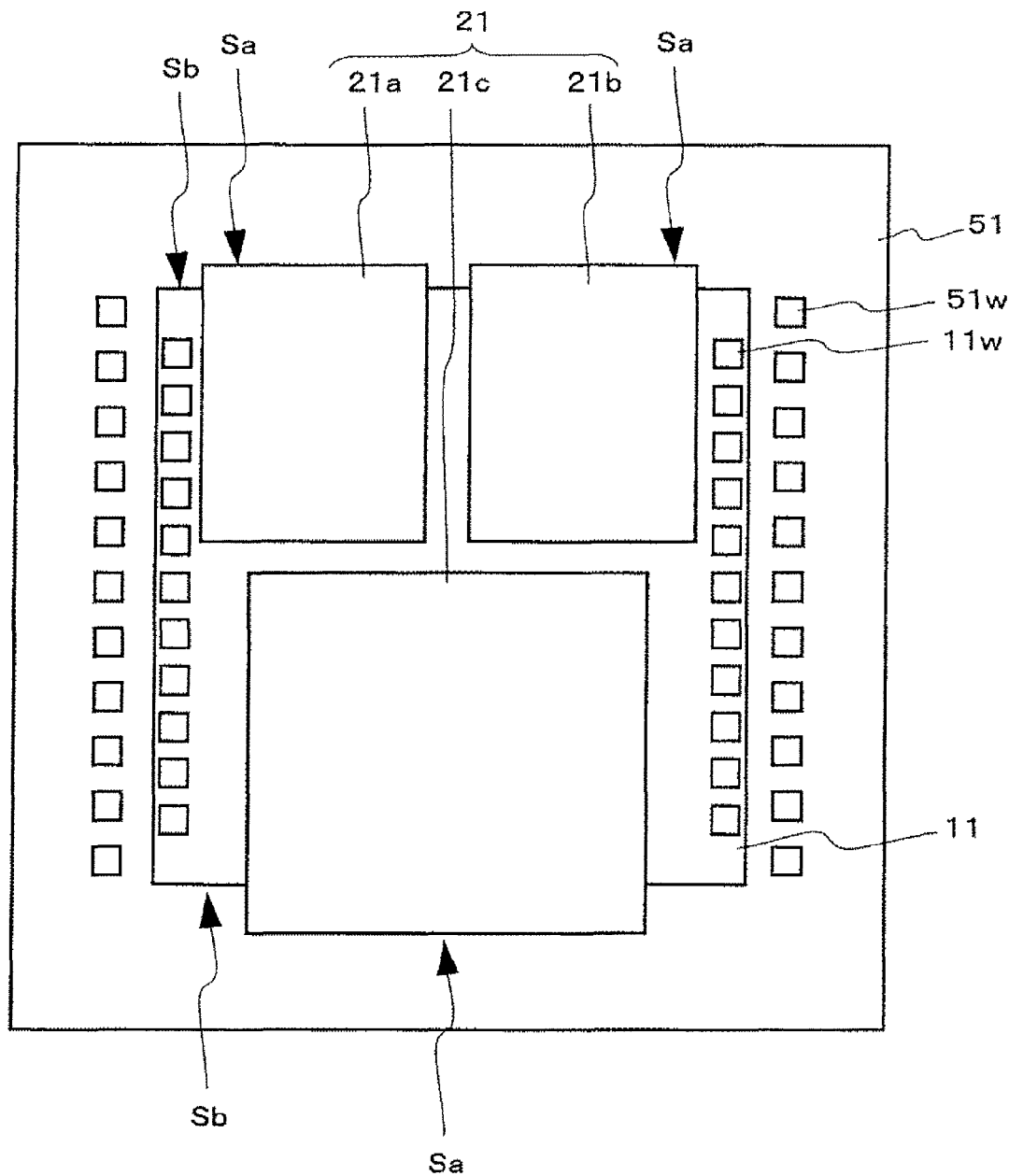
FIG. 9 is a plan view of the semiconductor device of FIG. 8.

FIGS. 8 and 9 illustrate the configuration of the semiconductor device according to a second embodiment of the present invention. FIG. 8 is a cross-sectional view of the semiconductor device 1, and FIG. 9 is a top face view of the semiconductor device 1. FIG. 8 illustrates a cross-section of an upper stage part of FIG. 9.

In this embodiment, the point that the plurality of optical wiring sections 21 are provided is different from the first embodiment. Except this point, this embodiment is the same as the first embodiment, and overlapping parts will be omitted in description.

In this embodiment, as illustrated in FIGS. 8 and 9, a first optical wiring section 21a, a second optical wiring section 21b, and a third optical wiring section 21c are provided as the optical wiring section 21.

The optical wiring sections 21a, 21b, and 21c are arranged on the top face of the semiconductor integrated circuit section 11. The connection section 31 is provided on the face side of the optical wiring sections 21a, 21b, and 21c facing the semiconductor integrated circuit section 11, and the optical wiring sections 21a, 21b, and 21c are electrically connected to the semiconductor integrated circuit section 11 through the connection section 31.

As described above, in this embodiment, the plurality of the optical wiring sections 21 are provided, and the plurality of optical wiring sections 21 are arranged in one semiconductor integrated circuit section 11. Except this point, this embodiment has the same configuration as the first embodiment. Thus, in this embodiment, it is possible to exhibit the same effects as the first embodiment.

<Third Embodiment>

Figure 10:
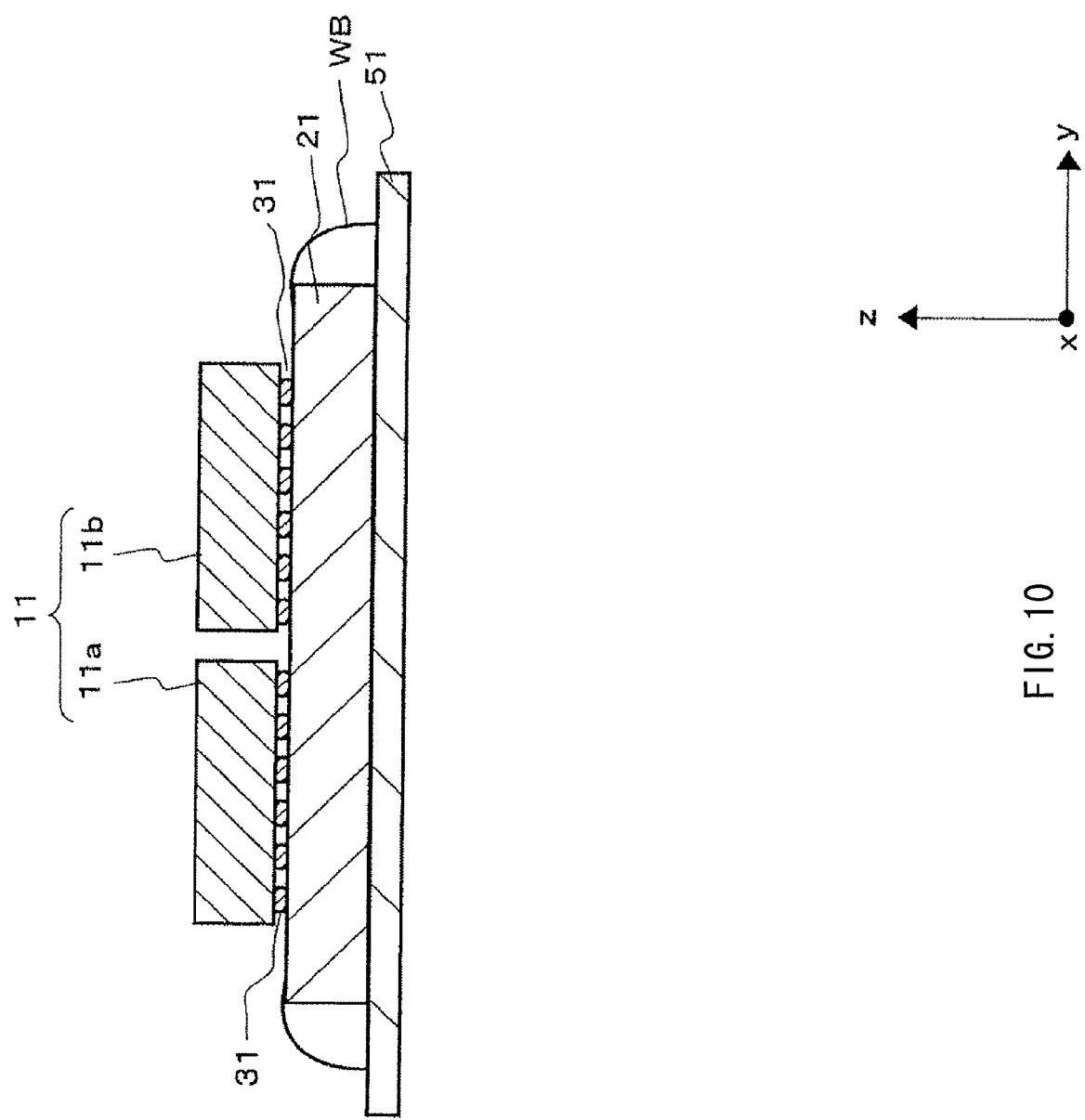
FIG. 10 is a cross-sectional view illustrating the semiconductor device according to a third embodiment of the present invention.

FIG. 10 illustrates the configuration of the semiconductor device 1 according to a third embodiment of the present invention.

In this embodiment, the plurality of semiconductor integrated circuit sections 11 are provided. Also, the positional relation between the semiconductor integrated circuit section 11 and the optical wiring section 21 to the interposer substrate 51 is different from that of the first embodiment. The optical wiring section 21 and the interposer substrate 51 are electrically connected by the wire bonding WB. Except these points, this embodiment is the same as the first embodiment, and overlapping parts will be omitted in description.

In this embodiment, a first semiconductor integrated circuit section 11a and a second semiconductor integrated circuit section 11b are provided as the semiconductor integrated circuit section 11.

The semiconductor integrated circuit sections 11a and 11b are arranged to face the optical wiring section 21, the connection section 31 is provided on the face sides of the semiconductor integrated circuit sections 11a and 11b facing the optical wiring section 21, and the semiconductor integrated circuit sections 11a and 11b are electrically connected to the optical wiring section 21 through the connection section 31.

The optical wiring section 21 is constituted to be electrically connected to the interposer substrate 51 through the wire bonding WB. For example, an electrical connection pad for wire bonding (not illustrated in the figure) is provided in the vicinity of the top face of the optical wiring section 21, and the above-described electrical connection is established by using this electrical connection pad.

As described above, in this embodiment, the plurality of semiconductor integrated circuit sections 11 are included, and the plurality of semiconductor integrated circuit sections 11 are electrically connected to the one optical wiring section 21. Except this point, this embodiment has the same configuration as the first embodiment. Thus, in this embodiment, it is possible to perform the clock distribution and the data transfer between the plurality of chips of the semiconductor integrated circuit sections 11a and 11b, and it is possible to exhibit the same effects as the first embodiment.

<Fourth Embodiment>

Figure 11:
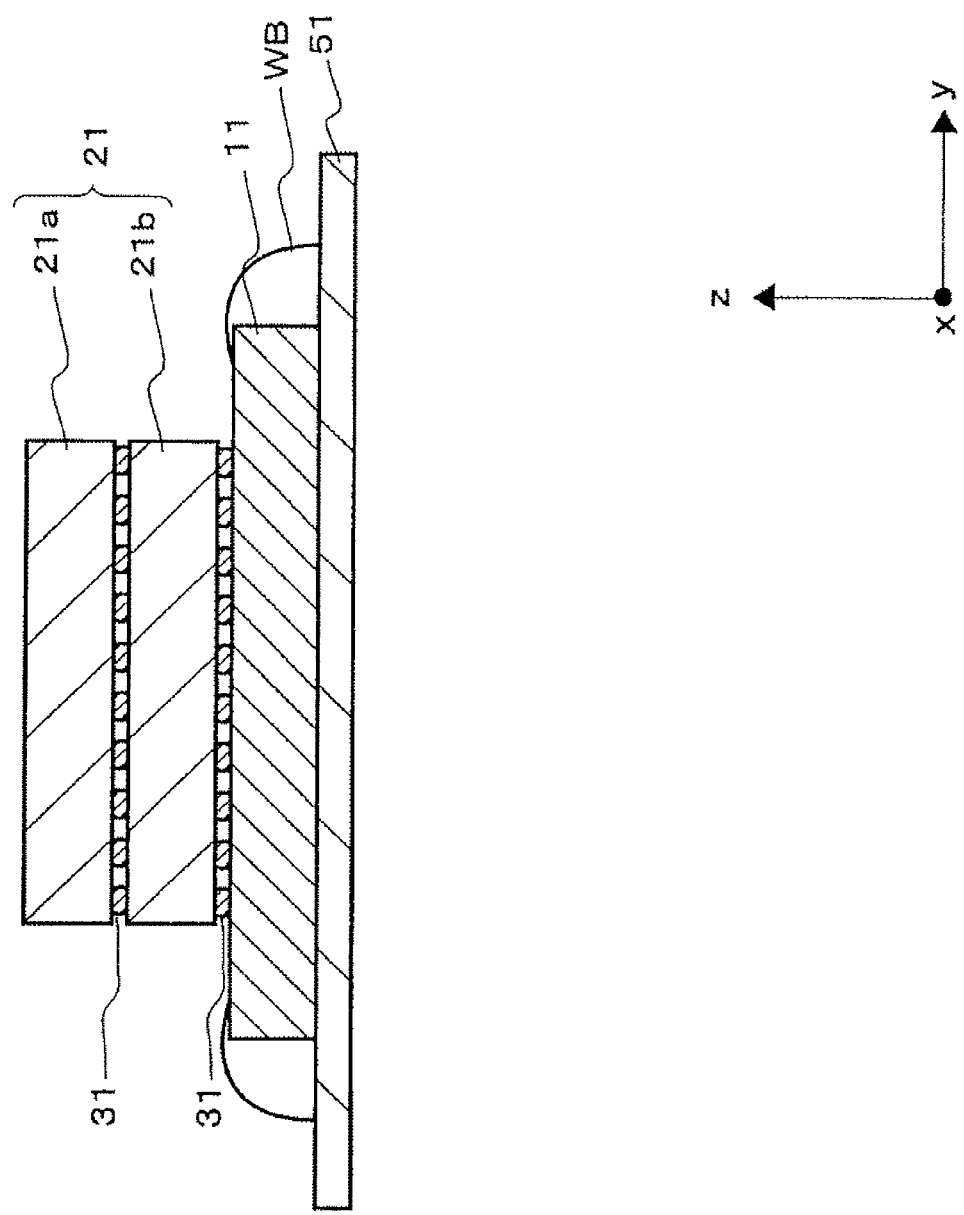
FIG. 11 is a cross-sectional view illustrating the semiconductor device according to a fourth embodiment of the present invention.

FIG. 11 illustrates the configuration of the semiconductor device 1 according to a fourth embodiment of the present invention.

In this embodiment, the point that the plurality of optical wiring sections 21 are provided is different from the first embodiment. Except this point, this embodiment is the same as the first embodiment, and overlapping parts will be omitted in description.

In this embodiment, the first optical wiring section 21a and the second optical wiring section 21b are provided as the optical wiring section 21.

The optical wiring sections 21a and 21b are arranged on the face of the semiconductor integrated circuit section 11.

The connection section 31 is provided on the face side of the optical wiring section 21a facing the semiconductor integrated circuit section 11, and the optical wiring section 21a is electrically connected to the semiconductor integrated circuit section 11 through the connection section 31. Specifically, the solder bump is provided as the connection section 31, and the optical wiring section 21a and the semiconductor integrated circuit section 11 are electrically connected through the solder bump.

The optical wiring section 21b is provided on the top face of the optical wiring section 21a. The connection section 31 is provided on the face side of the optical wiring section 21b facing the optical wiring section 21a, and the optical wiring section 21b is electrically connected to the optical wiring section 21a through the connection section 31. Specifically, the solder bump is provided as the connection section 31, and the optical wiring section 21a and the optical wiring section 21b are electrically connected through the solder bump.

As described above, in this embodiment, the plurality of optical wiring sections 21 are provided, and the plurality of optical wiring sections 21 are arranged to overlap each other on one semiconductor integrated circuit section 11. Except this point, this embodiment has the same configuration as the first embodiment, and it is possible to exhibit the same effects as the first embodiment.

<Fifth Embodiment>

Figure 12:
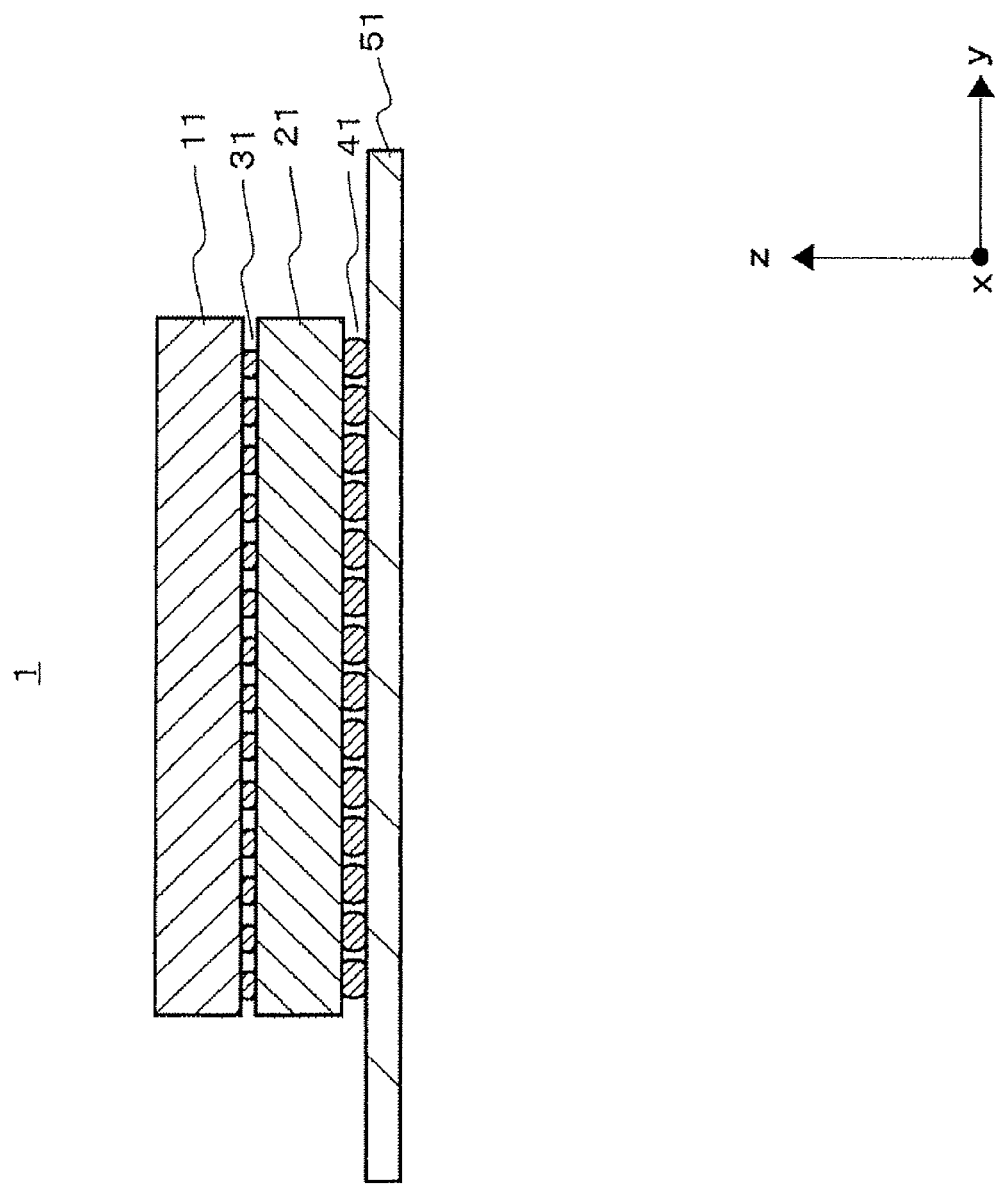
FIG. 12 is a cross-sectional view illustrating the semiconductor device according to a fifth embodiment of the present invention.
Figure 13:
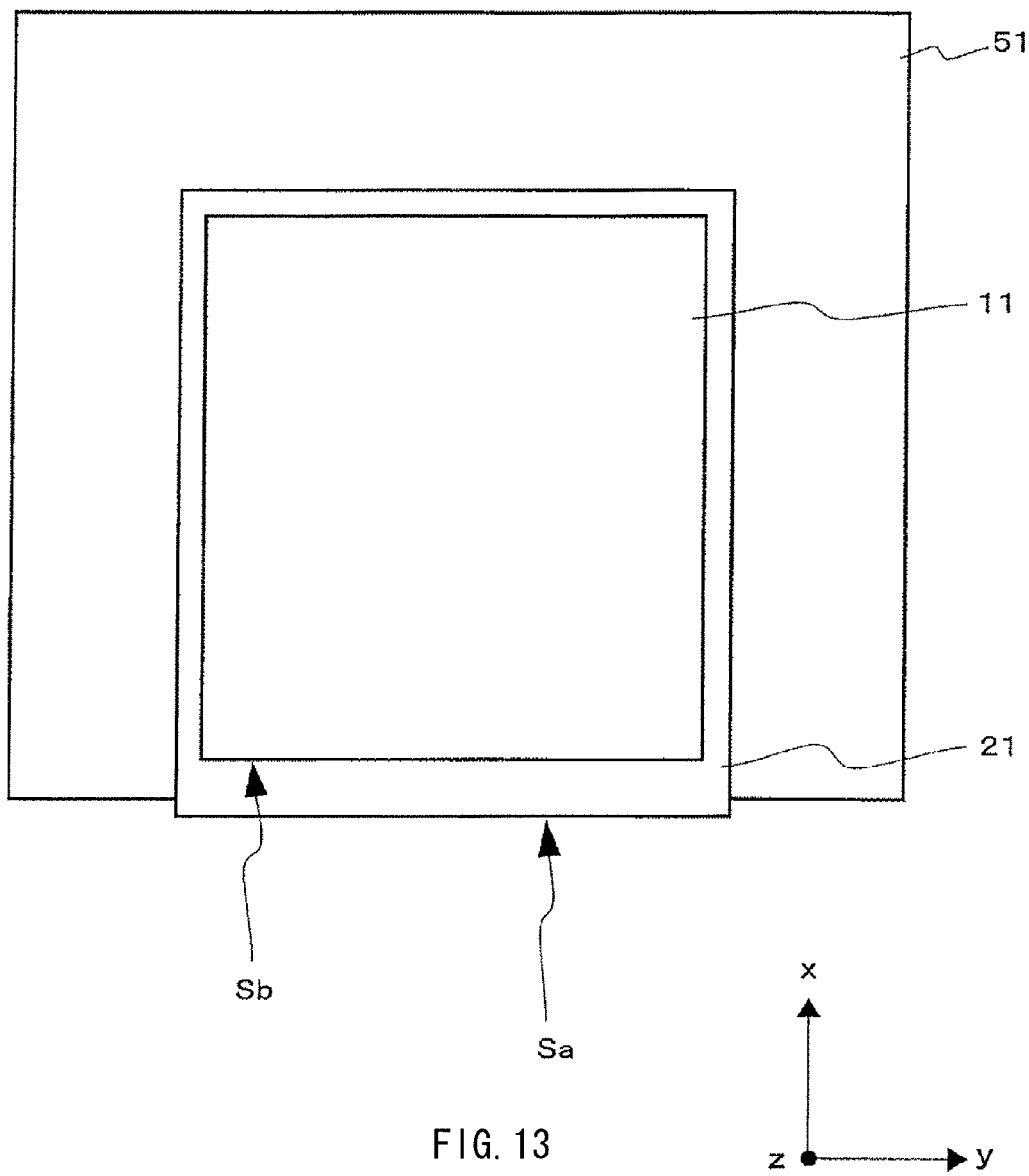
FIG. 13 is a plan view of the semiconductor device of FIG. 12.

FIGS. 12 and 13 illustrate the configuration of the semiconductor device 1 according to a fifth embodiment of the present invention. FIG. 12 is a cross-sectional view of the semiconductor device 1, and FIG. 13 is a top face view of the semiconductor device 1.

Figure 14:
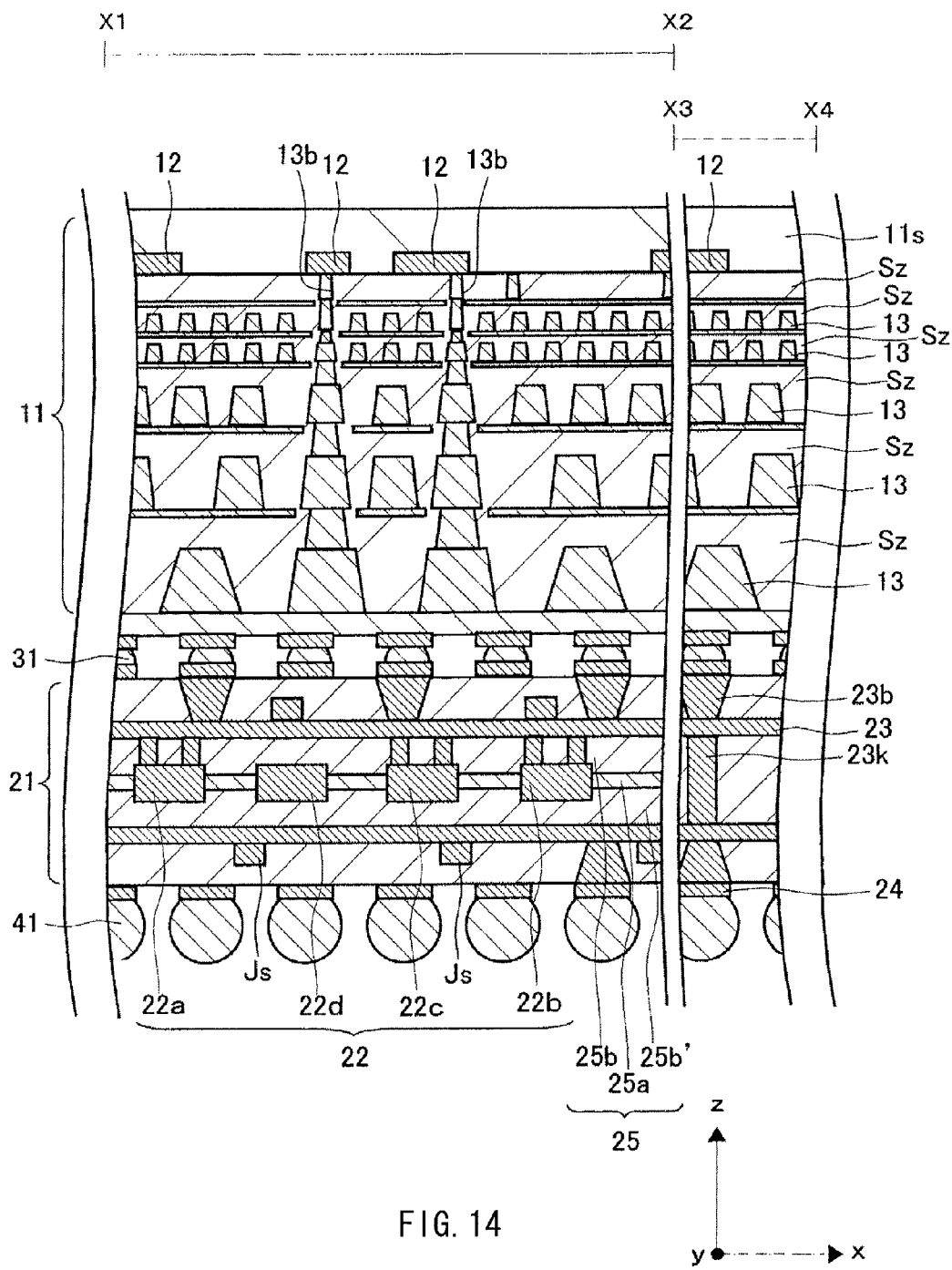
FIG. 14 is a cross-sectional view illustrating the main part of the semiconductor device of FIG. 12 in an enlarged manner.

FIG. 14 illustrates the main part of the semiconductor device 1 in an enlarged manner, and illustrates a cross section of an X1-X2 part, and a cross-section of an X3-X4 part different from the X1-X2 part.

As illustrated in FIGS. 12 to 14, like the first embodiment, the semiconductor device 1 of this embodiment includes the semiconductor integrated circuit section 11, the optical wiring section 21, and the connection section 31, but the positional relationship between the semiconductor integrated circuit section 11 and the optical wiring section 21 to the interposer substrate 51 is different from that of the first embodiment. Also, in this embodiment, unlike the first embodiment, an external terminal 41 is provided, while the wire bonding WB is not provided. Except these points, this embodiment is the same as the first embodiment, and overlapping parts will be omitted in description.

First, the semiconductor integrated circuit section 11 will be described.

As illustrated in FIG. 12, the semiconductor integrated circuit section 11 is arranged to face the optical wiring section 21. The connection section 31 is provided on the bottom face side of the semiconductor integrated circuit section 11 facing the optical wiring section 21, and the semiconductor integrated circuit section 11 is electrically connected to the optical wiring section 21 through the connection section 31. In this embodiment, unlike the case of the first embodiment, the semiconductor integrated circuit section 11 is arranged to face the interposer substrate 51 through the optical wiring section 21.

As illustrated in FIG. 13, the planar shape of the semiconductor integrated circuit section 11 is a rectangle shape, but the plurality of electrical connection pads 11w for the wire bonding are not provided unlike the first embodiment.

As illustrated in FIG. 14, each section identical to that of the first embodiment is provided in the semiconductor integrated circuit section 11.

Next, the optical wiring section 21 will be described.

As illustrated in FIG. 12, the optical wiring section 21 is arranged to face the semiconductor integrated circuit section 11. The connection section 31 is provided on the top face side of the optical wiring section 21 facing the semiconductor integrated circuit section 11, and the optical wiring section 21 is electrically connected to the semiconductor integrated circuit section 11 through the connection section 31. Like the first embodiment, the optical wiring section 21 is constituted to perform at least a part of the signal transmission in the semiconductor integrated circuit section 11 by transmitting the optical signal in the optical waveguide.

As illustrated in FIG. 13, the light input/output face Sa in which the light such as the optical signal is input to or output from is provided on the side face of the optical wiring section 21. In the optical wiring section 21, the light input/output face Sa of the optical wiring section 21 is arranged to protrude more outside than the side face Sb of the semiconductor integrated circuit section 11. The planar shape of the optical wiring section 21 is a rectangle shape.

In this embodiment, as illustrated in FIG. 14, each member is provided in the same manner as the first embodiment, except that the optical wiring section 21 is provided with the external terminal 41 unlike the first embodiment.

As illustrated in FIG. 12, the external terminal 41 is provided on the other face of the optical wiring section 21, which is on the opposite side to one face of the optical wiring section 21 facing semiconductor integrated circuit section 11. The external terminal 41 is formed of a conductive material, and electrically connects the optical wiring section 21, the interposer substrate 51, and the semiconductor integrated circuit section 11. For example, the external terminal 41 is a solder bump, and is provided to intervene between the electrical connection pad 24 provided on the bottom face of the optical wiring section 21, and the electrical connection pad (not illustrated in the figure) provided in the interposer substrate 51 to electrically connect the electrical connection pad 24 and the electrical connection pad to each other.

In this embodiment, the external terminal 41 is, for example, formed by bonding the solder bump arranged in the electrical connection pad 24 of the optical wiring section 21 to the interposer substrate 51. Thereby, a secondary mounting is performed such that the semiconductor integrated circuit section 11 on which the optical wiring section 21 is mounted by the firstly mounting is bonded to the interposer substrate 51.

In the secondary mounting, it is preferable to use the solder bump at a melting temperature lower than that of the solder bump used in the firstly mounting.

For example, in the case where the soldering material of Sn—Ag—Cu is used, the secondary mounting is performed at a temperature of approximately 270° C., and it is thus preferable to use a AuSn bump (Au:Sn=80wt %:20wt %) having the melting temperature of approximately 280° C. Thereby, it is possible to preferably maintain the fixed state in the firstly mounting.

In addition, the external terminal 41 may be used to be bonded to the mother board, instead of bonding the interposer substrate 51.

For example, an electrical signal is input to the external terminal 41, and the electrical signal is sequentially transmitted to the electrical connection pad 24, the electrical wiring 23, and the via wiring 23k. The electrical signal is transmitted to the semiconductor integrated circuit section 11 through the electrical wiring 23 and the electrical connection pad 24 disposed on the upper side. Here, the electrical signal input from the external terminal 41 is directly transmitted to the semiconductor integrated circuit section 11 through each of the sections without intervention of the optical element 22 and the optical waveguide 25. In addition, the external terminal 41 is constituted to be electrically connected to a through hole via (not illustrated in the figure) formed through the optical wiring section 21, and may be directly connected to the connection section 31.

Like the first embodiment, the opt-electric conversion element 22a of the optical wiring section 21 is, for example, the plasmon antenna type photodiode, and converts the optical signal transmitted by the optical waveguide 25 into the electrical signal. In this embodiment, for example, the opt-electric conversion element 22a receives the optical signal converted by the electro-optical conversion element 22b from the electrical signal input from the external terminal 41 and transmitted by the optical waveguide 25, and converts the optical signal into the electrical signal. Also, like the first embodiment, the electro-optical conversion element 22b is, for example, the laser diode, and converts the electrical signal into the optical signal. In this embodiment, the electro-optical conversion element 22b converts, for example, the electrical signal input from the external terminal 41 into the optical signal. Also, like the first embodiment, the electro-optical conversion element 22b is, for example, the Mach-Zehnder type optical modulation element, modulates the optical signal transmitted and input by the optical waveguide 25, and outputs the signal to the optical waveguide 25. In the case where the optical switch element 22c is provided as the optical element 22, and is connected to the external terminal 41, for example, the optical switch element turns on/off the light passing through the optical waveguide 25, and switches the optical path with the electrical signal from the external terminal 41.

Figure 15:
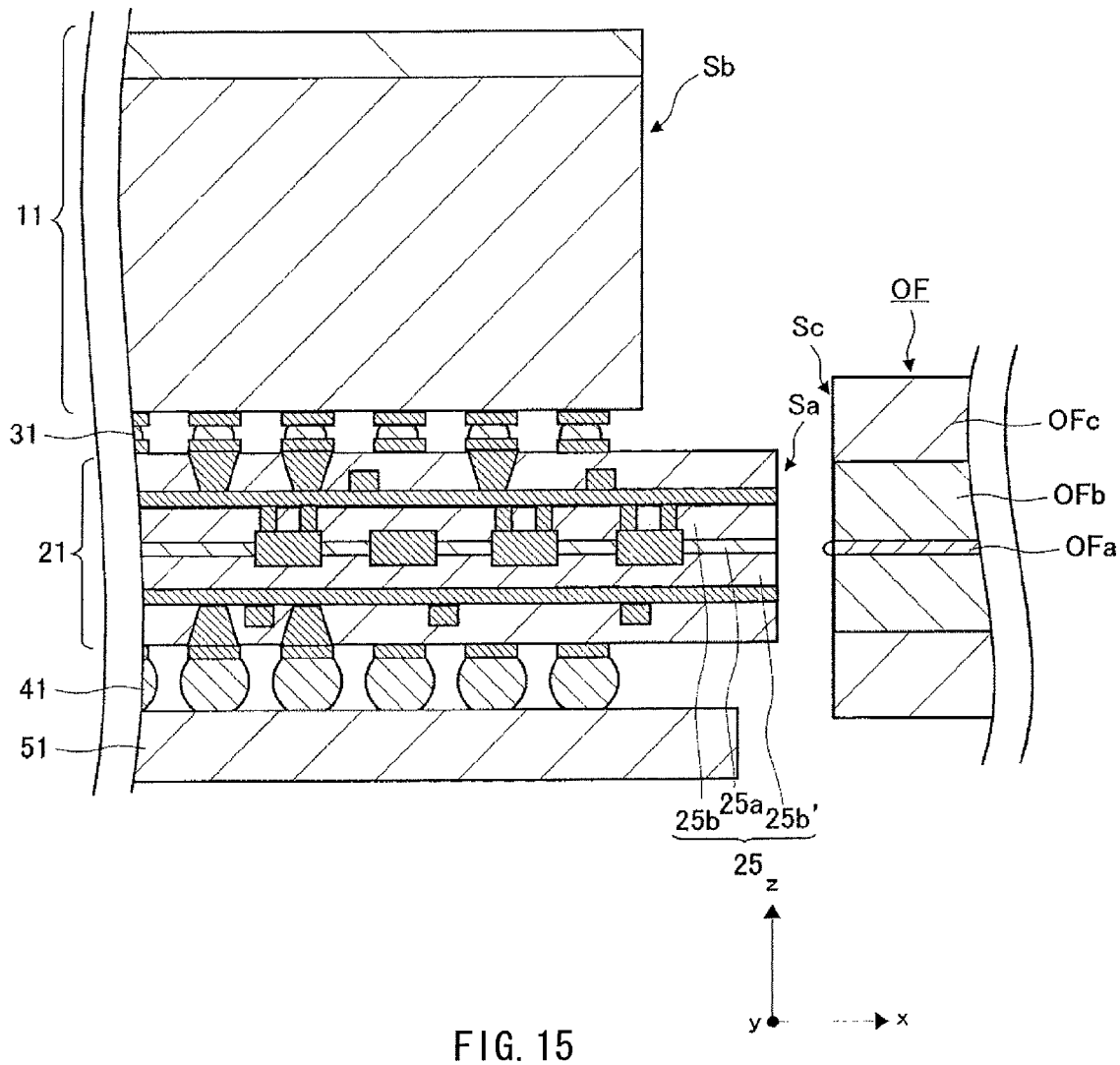
FIG. 15 is a view illustrating the state where the optical fiber is optically coupled to the optical wiring section of the semiconductor device.
Figure 16:
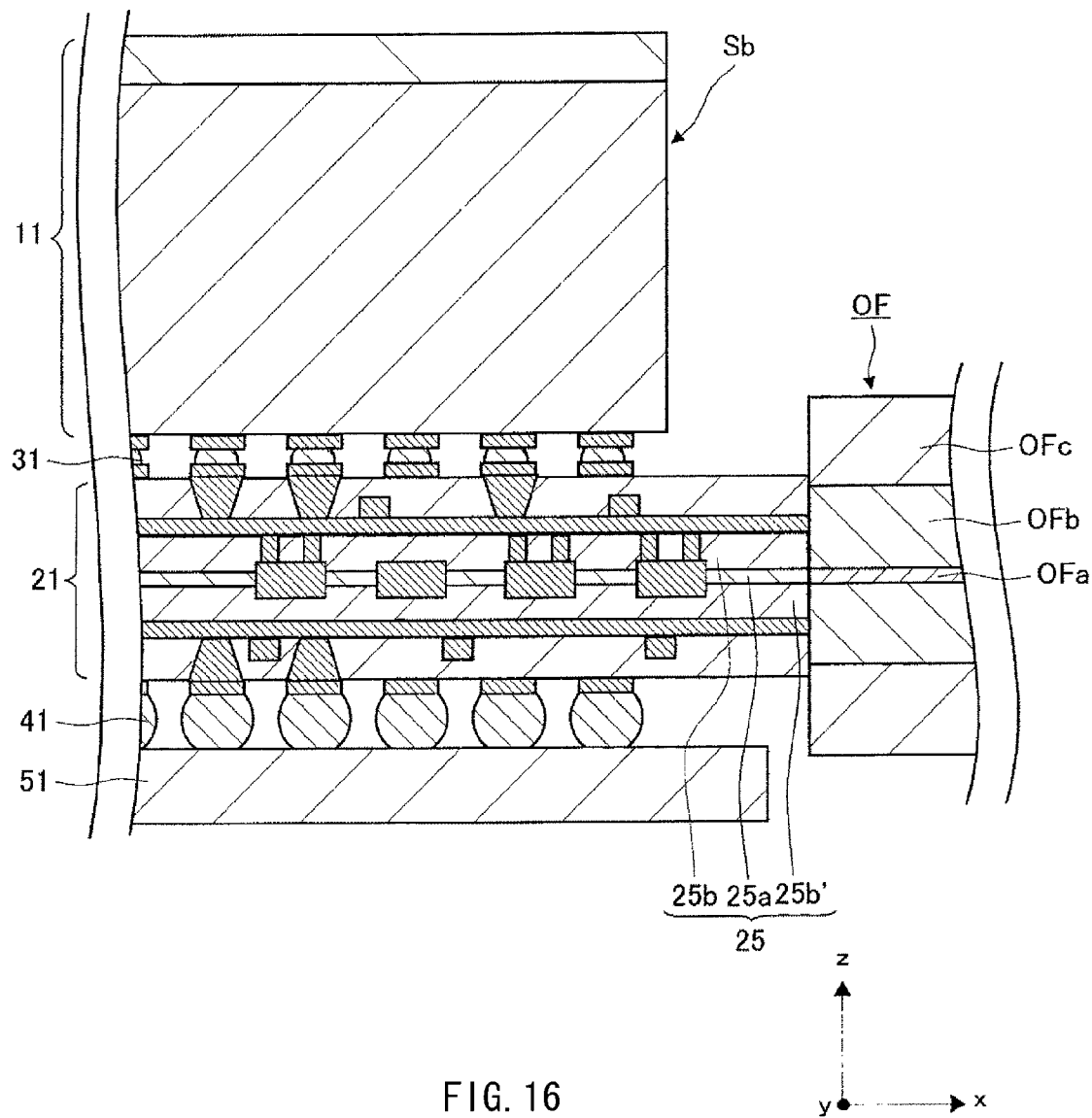
FIG. 16 is a view illustrating the state where the optical fiber is optically coupled to the optical wiring section of the semiconductor device.

In this embodiment, FIGS. 15 and 16 illustrate the state where the optical fiber OF is optically coupled to the optical wiring section 21 of the semiconductor device 1.

First, as illustrated in FIG. 15, the optical fiber OF is aligned in position with the optical wiring section 21.

Here, the position alignment is performed by facing the light input/output face Sc of the optical fiber OF, which the light is input to or output from, to the light input/output face Sa of the optical wiring section 21, which the light such as the optical signal is input from or output to.

Specifically, the optical fiber OF including the core OFa, the clad OFb and the cover OFc is prepared. Here, the optical fiber OF in which the clad OFb is provided in the surrounding of the core OFa, and the cover OFc is provided in the surrounding of the clad OFb is prepared.

Next, the optical fiber OF is aligned in position with the optical wiring section 21 so that the portion of the light input/output face Sa provided with the core 25a, and the portion of the light input/output face Sc provided with the core OFa face each other.

Subsequently, as illustrated in FIG. 16, the optical fiber OF is optically coupled to the optical wiring section 21.

Here, the optical fiber OF is moved to the optical wiring section 21 so that the light input/output face Sc of the optical fiber OF is in contact with the light input/output face Sa of the optical wiring section 21.

Next, the portion of the light input/output face Sa in the optical wiring section 21 provided with the core 25a, and the portion of the light input/output face Sc in the optical fiber OF provided with the core OFa are optically coupled.

As described above, in this embodiment, the external terminal 41 is provided on the other face of the optical wiring section 21, which is on the opposite side to the one face of the optical wiring section 21 facing the semiconductor integrated circuit section 11. In the semiconductor integrated circuit section 11, although there is a case that the device is increased in size due to an increase of the I/O terminals accompanied by high performance, it is possible to easily realize size reduction of the device by providing the external terminal 41 on the other face of the optical wiring section 21 like this embodiment. In other words, the flip chip bonding method, and the C4 (Controlled Collapse Chip Connection) bonding method are applicable, so it is possible to easily exhibit this effect. Herewith, in this embodiment, it is possible to easily deal with the high-speed transmission, and deal with stabilization of the power source supply. Also, the element which has been difficult to be manufactured due to restrictions of the processes and the design rules in the semiconductor integrated circuit section 11 can be easily manufactured in the optical wiring section 21, so it is possible to easily realize improvement of the characteristics by this embodiment. Further, in this embodiment, because the electrical transmission line through the interposer substrate and the mother board is not used, design of the high-speed electrical transmission line, and use of a material with excellent high-frequency characteristics are not necessary, and it is preferable.

<Sixth Embodiment>

Figure 17:
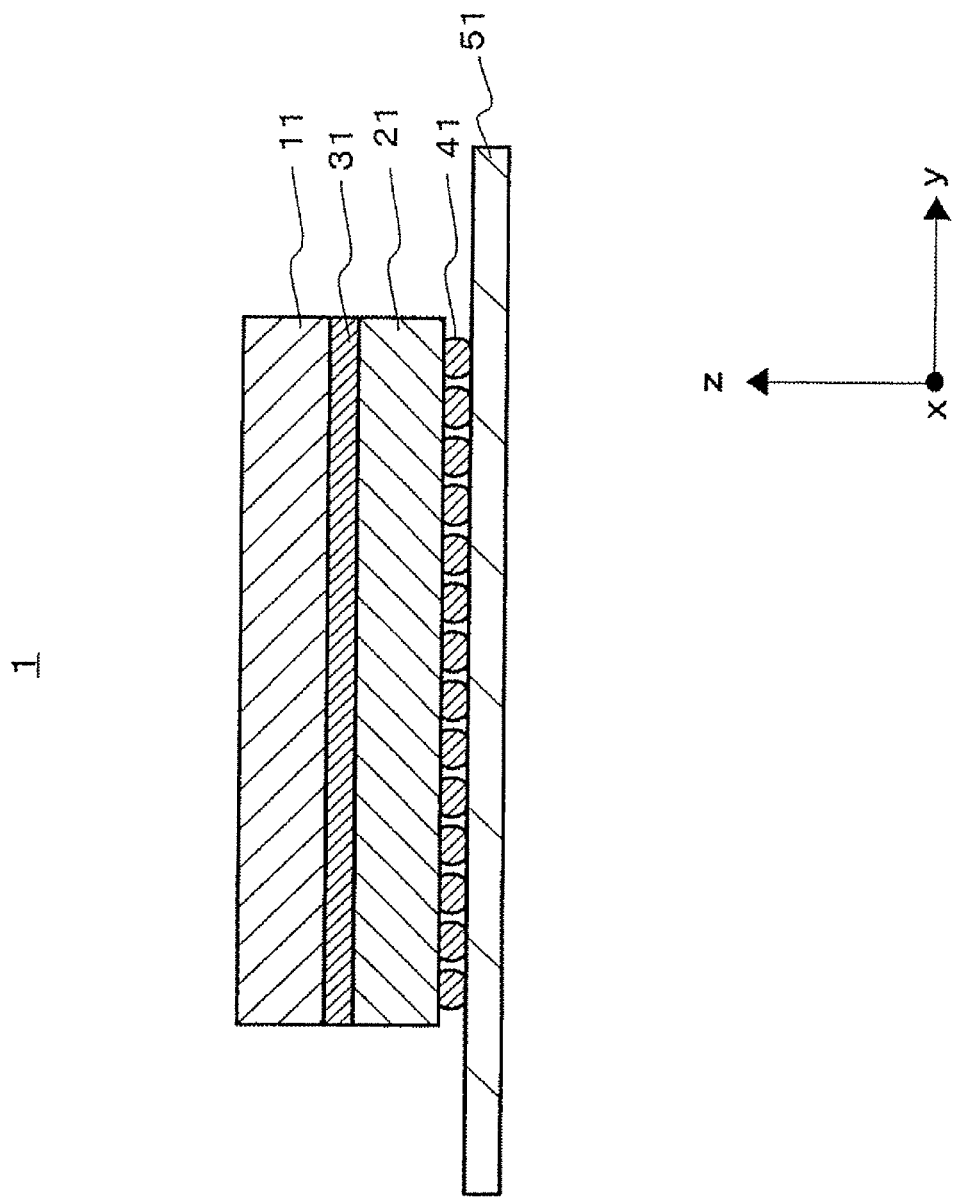
FIG. 17 is a cross-sectional view illustrating the semiconductor device according to a sixth embodiment of the present invention.

FIG. 17 illustrates the configuration of the semiconductor device 1 according to a sixth embodiment of the present invention.

In this embodiment, the connection section 31 is different from that of the fifth embodiment. Except this point, this embodiment is the same as the fifth embodiment, and overlapping parts will be omitted in description.

The connection section 31 is provided between the face of the optical wiring section 21, and the face of the semiconductor integrated circuit section 11, which face each other. The connection section 31 is formed by using a conductive resin, and electrically connects the optical wiring section 21 and the semiconductor integrated circuit section 11. The connection section 31 may be formed by using an anisotropic conductive adhesive sheet.

Except the point that the connection section 31 is formed by using the conductive resin, this embodiment has the same configuration as the fifth embodiment, and it is possible to exhibit the same effects as the fifth embodiment.

<Seventh Embodiment>

Figure 18:
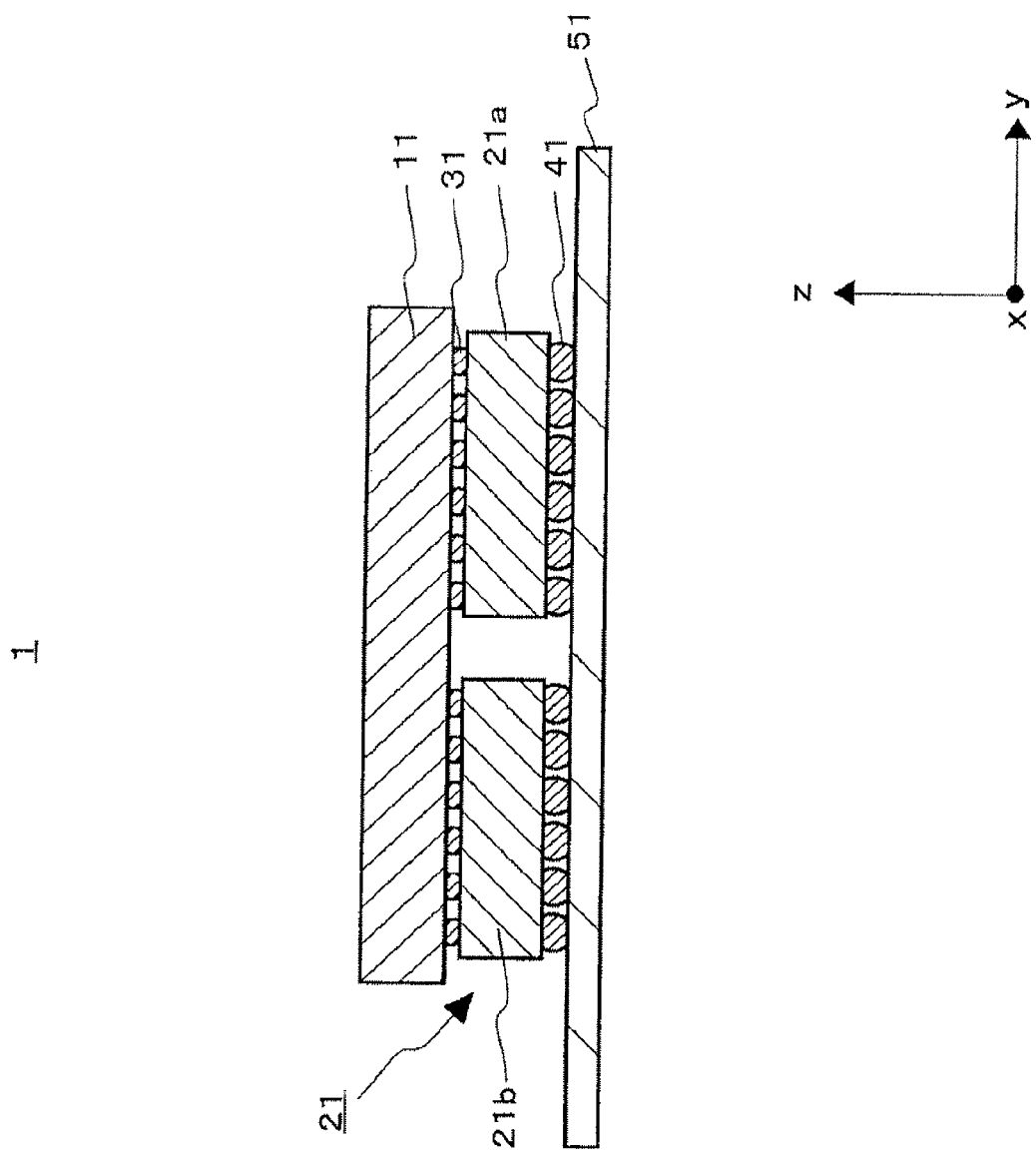
FIG. 18 is a cross-sectional view illustrating the semiconductor device according to a seventh embodiment of the present invention.

FIG. 18 illustrates the configuration of the semiconductor device 1 according to a seventh embodiment of the present invention.

In this embodiment, the point that the plurality of optical wiring sections 21 are provided is different from the fifth embodiment. Except this point, this embodiment is the same as the fifth embodiment, and overlapping parts will be omitted in description.

In this embodiment, the first optical wiring section 21a and the second optical wiring section 21b are provided as the optical wiring section 21.

The optical wiring sections 21a and 21b are arranged to face the semiconductor integrated circuit section 11. The connection section 31 is provided on the face side of optical wiring sections 21a and 21b, which face the semiconductor integrated circuit section 11, and the optical wiring sections 21a and 21b are electrically connected to the semiconductor integrated circuit section 11 through the connection section 31.

The external terminal 41 is provided on the faces of the optical wiring sections 21a and 21b, which are on the opposite side to the faces of the optical wiring sections 21a and 21b facing the semiconductor integrated circuit section 11.

Except the point that the plurality of optical wiring sections 21 are provided, this embodiment has the same configuration as the fifth embodiment, and it is possible to exhibit the same effects as the fifth embodiment.

<Eighth Embodiment>

Figure 19:
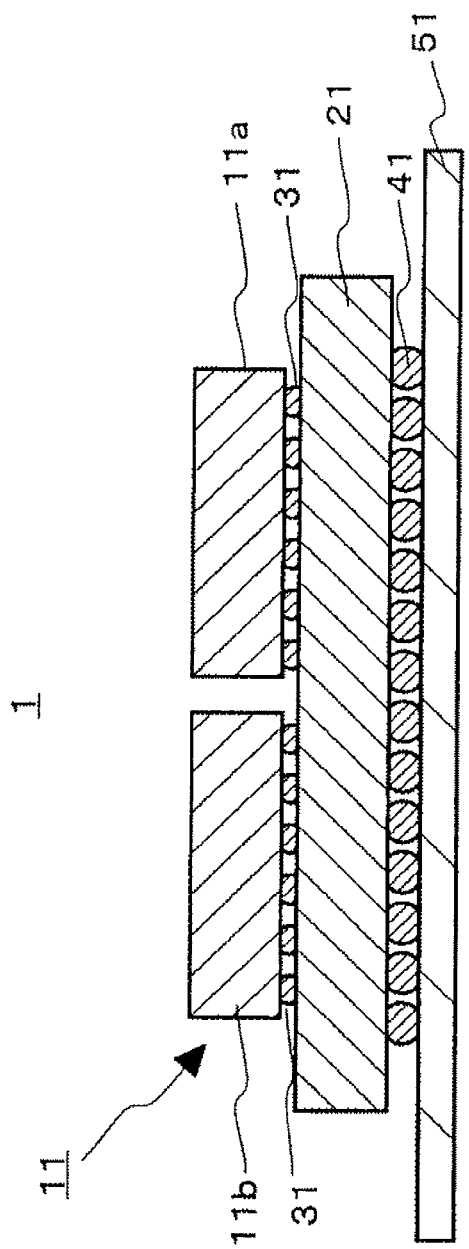
FIG. 19 is a cross-sectional view illustrating the semiconductor device according to an eighth embodiment of the present invention.
Figure 19:
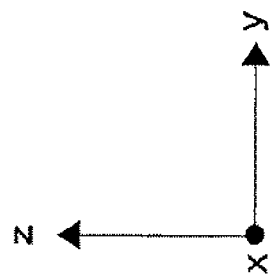

FIG. 19 illustrates the configuration of the semiconductor device 1 according to an eighth embodiment of the present invention.

In this embodiment, the point that the plurality of semiconductor integrated circuit sections 11 are provided is different from the fifth embodiment. Except this point, this embodiment is the same as the fifth embodiment, and overlapping parts will be omitted in description.

In this embodiment, the first semiconductor integrated circuit section 11a and the second semiconductor integrated circuit section 11b are provided as the semiconductor integrated circuit section 11.

The semiconductor integrated circuit sections 11a and 11b are arranged to face the optical wiring section 21. The connection section 31 is provided on the face side of the semiconductor integrated circuit sections 11a and 11b, which face the optical wiring section 21, and the semiconductor integrated circuit sections 11a and 11b are electrically connected to the optical wiring section 21 through the connection section 31. Thus, the clock distribution, and the data transmission can be performed between the plurality of chips of the semiconductor integrated circuit sections 11a and 11b.

Except the point that the plurality of semiconductor integrated circuit sections 11 are provided, this embodiment has the same configuration as the fifth embodiment, and it is possible to exhibit the same effects as the fifth embodiment.

<Ninth Embodiment>

Figure 20:
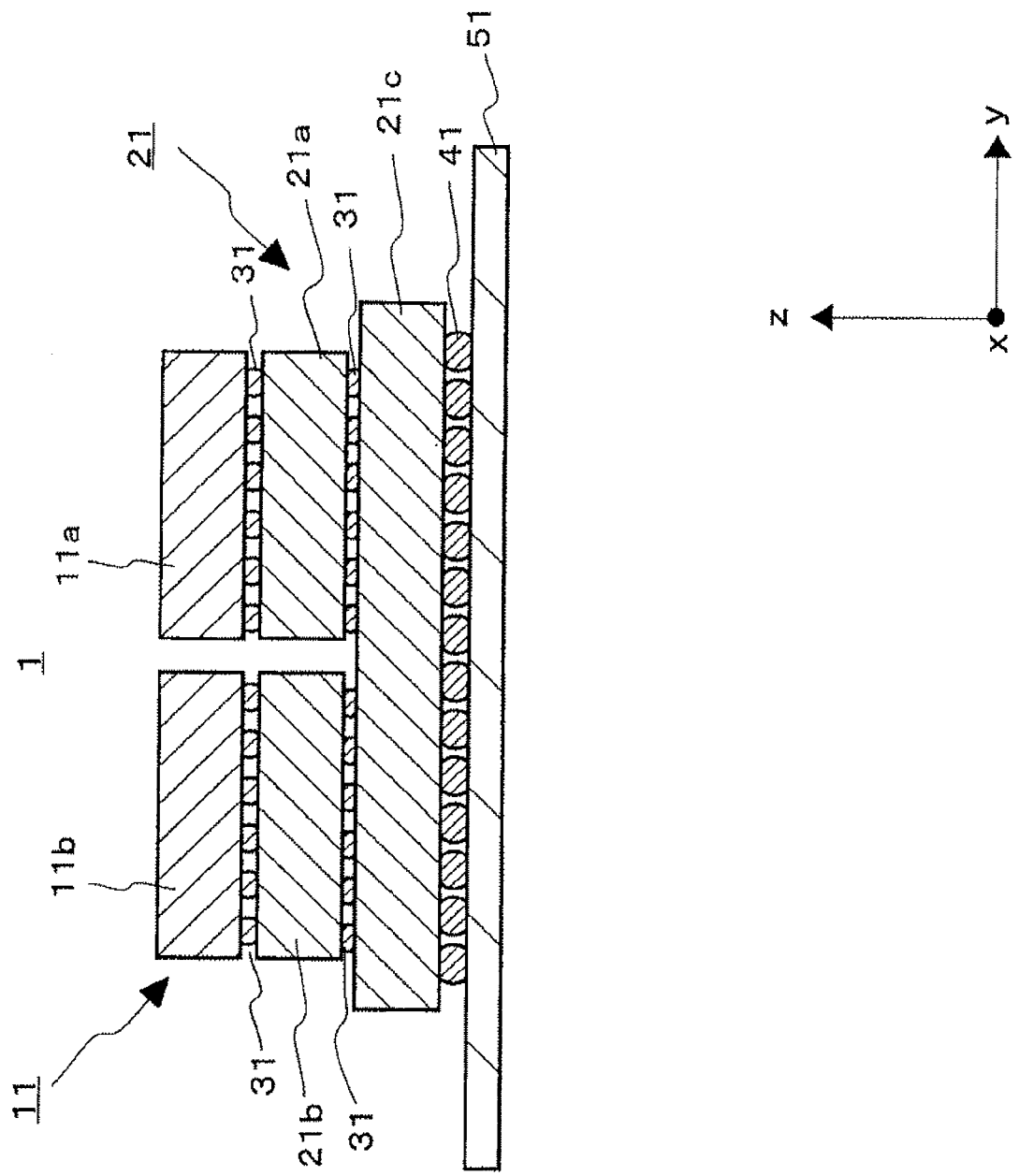
FIG. 20 is a cross-sectional view illustrating the semiconductor device according to a ninth embodiment of the present invention.

FIG. 20 illustrates the configuration of the semiconductor device 1 according to ninth embodiment of the present invention.

In this embodiment, the point that the plurality of semiconductor integrated circuit sections 11 are provided, and the point that the plurality of optical wiring sections 21 are provided are different from the fifth embodiment. Except these points, this embodiment is the same as the fifth embodiment, and overlapping parts will be omitted in description.

In this embodiment, the first semiconductor integrated circuit section 11a and the second semiconductor integrated circuit section 11b are provided as the semiconductor integrated circuit section 11.

The first optical wiring section 21a, the second optical wiring section 21b, and the third optical wiring section 21c are provided as the optical wiring section 21.

The first semiconductor integrated circuit section 11a is arranged to face the first optical wiring section 21a. The connection section 31 is provided on the face side of the semiconductor integrated circuit section 11a, which faces the optical wiring section 21a, and the semiconductor integrated circuit section 11a is electrically connected to the optical wiring section 21a through the connection section 31.

The second semiconductor integrated circuit section 11b is arranged to face the second optical wiring section 21b. The connection section 31 is provided on the face side of the semiconductor integrated circuit section 11b, which faces the optical wiring section 21b, and the semiconductor integrated circuit section 11b is electrically connected to the optical wiring section 21b through the connection section 31.

The third optical wiring section 21c is arranged on the face of the first optical wiring section 21a, which is on the opposite side to the face of the first optical wiring section 21a facing the first semiconductor integrated circuit section 11a. The connection section 31 is provided on the face side of the optical wiring section 21a facing the optical wiring section 21c, and the optical wiring section 21a is electrically connected to the optical wiring section 21c through the connection section 31.

The third optical wiring section 21c is arranged on the face of the second optical wiring section 21b, which is on the opposite side to the face of the second optical wiring section 21b facing the second semiconductor integrated circuit section 11b. The connection section 31 is provided on the face side of the optical wiring section 21b facing the optical wiring section 21c, and the optical wiring section 21b is electrically connected to the optical wiring section 21c through the connection section 31.

The interposer substrate 51 is arranged on the face of the third optical wiring section 21c, which is on the opposite side to the face of the third optical wiring section 21c facing the first and second semiconductor integrated circuit sections 11a and 11b. The external terminal 41 is provided on the face side of the optical wiring section 21c facing the interposer substrate 51, and the optical wiring section 21c is electrically connected to the interposer substrate 51 through the external terminal 41.

Except the point that the plurality of semiconductor integrated circuit sections 11 are provided, and the point that the plurality of the optical wiring sections 21 are provided, this embodiment has the same configuration as the fifth embodiment, and it is possible to exhibit the same effects as the fifth embodiment.

<Tenth Embodiment>

Figure 21:
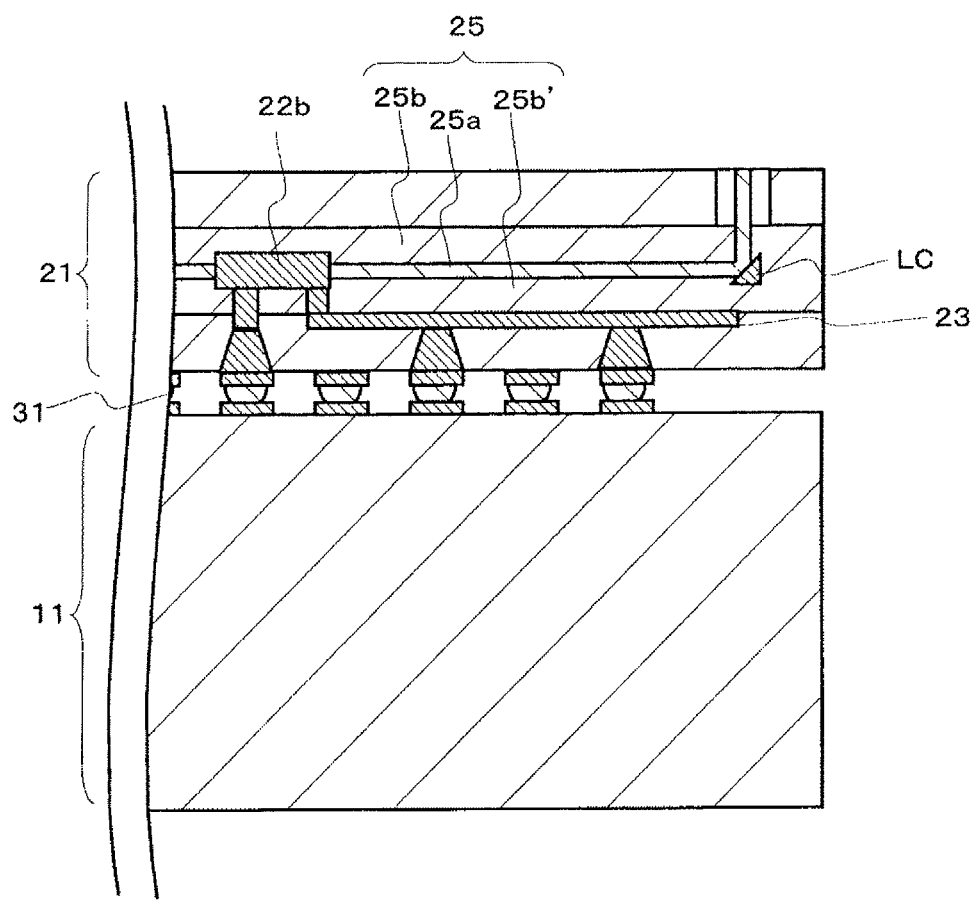
FIG. 21 is a cross-sectional view illustrating the semiconductor device according to a tenth embodiment of the present invention.

FIG. 21 illustrates the main part of the semiconductor device 1 according to a tenth embodiment of the present invention.

In this embodiment, an optical path conversion section LC is provided in the optical wiring section 21. Except this point, this embodiment is the same as the first embodiment, and overlapping points will be omitted in description.

The optical path conversion section LC is constituted to switch an optical path of the optical waveguide 25 in an opposite direction to the direction in which the optical path conversion section LC faces the semiconductor integrated circuit section 11, and perform light input to or light output from the opposite side of the face in which the optical wiring section 21 faces the semiconductor integrated circuit section 11.

For example, the optical conversion section LC is a mirror which reflects light on a reflection face, and is provided so that the reflection face is inclined to a direction in which the core 25a of the optical waveguide 25 extends in the xy plane. For example, the optical path conversion circuit LC emits the light emitted from the electro-optical conversion circuit 22b and transmitted along the xy plane in the core 25a of the optical waveguide 25, in a direction which is vertical to the xy plane, and where the optical wiring section 21 faces the semiconductor integrated circuit section 11.

The upper portion of the optical path conversion circuit LC may be provided with the optical waveguide 25, or, may be constituted to perform a space transmission by simply opening a hole.

When the present invention is carried out, it is not limited to the above-described embodiments, and various modifications can be adopted.

For example, in the above-described embodiments, although the case where the external terminal 41 includes the solder bump has been described, it is not limited to this. For example, the external terminal 41 may be constituted of only the electrical connection pad without using the solder bump.

Also, in the above-described embodiments, although the case where the plurality of types of optical elements 22 in addition to the opt-electric conversion element are provided in the optical wiring section 21 has been described, it is not limited to this. Also, the case where the via wiring 23k is provided in the optical wiring section 21 has been described, it is not limited to this. It is possible to appropriately provide elements, wirings, and the like, if necessary.

In the above-described embodiments, the semiconductor device 1 corresponds to a semiconductor device of the present invention, the semiconductor integrated circuit section 11 corresponds to a semiconductor integrated circuit section of the present invention, the first semiconductor integrated circuit section 11a corresponds to a semiconductor integrated circuit section of the present invention, the second semiconductor integrated circuit section 11b corresponds to a semiconductor integrated circuits section of the present invention, the semiconductor substrate 11s corresponds to a substrate of the present invention, the optical wiring section 21 corresponds to an optical wiring section of the present invention, the first optical wiring section 21a corresponds to an optical wiring section of the present invention, the second optical wiring section 21b corresponds to an optical wiring section of the present invention, the third optical wiring section 21c corresponds to an optical wiring section of the present invention, and the opt-electric conversion element 22a and the electro-optical conversion element 22b correspond to an optical active element of the present invention, respectively. Also, in the above-described embodiments, the via wiring 23k corresponds to a via wiring of the present invention, the optical waveguide 25 corresponds to an optical waveguide of the present invention, the connection section 31 corresponds to a connection section of the present invention, the external terminal 41 corresponds to an external terminal of the present invention, and the interposer substrate 51 corresponds to an interposer substrate of the present invention, respectively.

The invention claimed is:

1. A semiconductor device comprising:
   a semiconductor integrated circuit section;
   an optical wiring section arranged to face the semiconductor integrated circuit section in a vertical direction, the optical wiring section including an optical waveguide, an optical active element in and extending through the optical waveguide and electrical wiring arranged in the optical waveguide or adjacent to the optical waveguide; and
   a connection section provided between a face of the optical wiring section and a face of the semiconductor integrated circuit section which face each other, the connection section electrically connecting the optical wiring section to the semiconductor integrated circuit section,
   wherein,
      the electrical wiring in the optical wiring section extends in a horizontal direction parallel to the face of the optical wiring section,
      the optical waveguide confines light to the horizontal direction,
      the optical active element is optically coupled to the optical waveguide in the horizontal direction, and
      the optical waveguide is a layer with a thickness in the vertical direction that is sufficiently less than a height of the optical active element in the vertical direction so as to confine light to the horizontal direction relative to the optical active element.

2. The semiconductor device according to claim 1, wherein:
   the semiconductor integrated circuit section is divided into a plurality of circuit blocks, and
   the electrical wiring of the optical wiring section is provided as at least a part of a global wiring electrically connecting between the plurality of circuit blocks provided in the semiconductor integrated circuit section.

3. The semiconductor device according to claim 1, wherein the electrical wiring of the optical wiring section includes at least one of a power source wiring and a ground wiring electrically connected to the semiconductor integrated circuit section.

4. The semiconductor device according to claim 1, wherein the electrical wiring of the optical wiring section is constituted to transmit at least one electrical signal of a data signal and a clock signal to the semiconductor integrated circuit section.

5. The semiconductor device according to claim 1, wherein:
   the semiconductor integrated circuit section includes a via provided along a direction in which the semiconductor integrated circuit section and the optical wiring section face each other, and
   the via electrically connects a semiconductor element provided in the semiconductor integrated circuit section, and the optical wiring section.

6. The semiconductor device according to claim 1, wherein:
   the optical wiring section includes a via provided along the direction in which the optical wiring section and the semiconductor integrated circuit section face each other, and
   the via electrically connects the optical active element, the electrical wiring, and the semiconductor integrated circuit section.

7. The semiconductor device according to claim 1, wherein the optical active element converts an optical signal transmitted by the optical waveguide into an electrical signal, and the electrical signal is output to the semiconductor integrated circuit section through the connection section.

8. The semiconductor device according to claim 1, wherein the optical active element converts an electrical signal transmitted from the semiconductor integrated circuit section through the connection section into an optical signal, and the optical signal is transmitted by the optical waveguide.

9. The semiconductor device according to claim 1, wherein the optical active element is an optical switch element turning on/off light passing through the optical waveguide, and switching an optical path with the electrical signal transmitted from the semiconductor integrated circuit section through the connection section.

10. The semiconductor device according to claim 1, wherein the electrical wiring is formed along a planar direction in which the optical waveguide extends in the optical wiring section, in a position of a core of the optical waveguide, in a position on a side of the core facing the semiconductor integrated circuit section, or in a position on an opposite side to the side of the core facing the semiconductor integrated circuit section.

11. The semiconductor device according to claim 1, wherein:
    the optical wiring section further includes an electrical passive element, and
    the electrical wiring provided in the optical wiring section is electrically connected to the electrical passive element.

12. The semiconductor device according to claim 1, wherein:
    the connection section electrically connects the semiconductor integrated circuit section and the optical wiring section by using an electrical connection pad provided in the semiconductor integrated circuit section, and an electrical connection pad provided in the optical wiring section, and
    the electrical connection pad provided in the semiconductor integrated circuit section, and the electrical connection pad provided in the optical wiring section are electrically connected by direct connection, or through one of a soldering material, a conductive adhesive material, and an anisotropic conductive adhesive film, in a state of the electrical connection pads as they are, or in a state where a bump is formed on at least one of the electrical connection pads.

13. The semiconductor device according to claim 1, wherein:

a light input/output face in which light is input to or output from is provided on at least one side face of the optical wiring section, and the light input/output face of the optical wiring section is arranged to protrude more outside than a side face of the semiconductor integrated circuit section.

14. The semiconductor device according to claim 1, wherein the optical wiring section includes at least one optical path conversion section switching the optical path of the optical waveguide in an opposite direction to a direction in which the optical wiring section faces the semiconductor integrated circuit section, and performing light input to or light output from a face on an opposite side to the direction in which the optical wiring section faces the semiconductor integrated circuit section.

15. The semiconductor device according to claim 1, wherein a conductive external terminal is provided on one face of the optical wiring section, which is on an opposite side to the face of the optical wiring section facing the semiconductor integrated section.

16. The semiconductor device according to claim 15, wherein the external terminal is electrically connected to the optical active element, the electrical wiring, or a through hole via formed through the optical wiring section, and directly connected to the connection section.

17. The semiconductor device according to claim 15, wherein the external terminal is electrically connected to an interposer substrate or a mother board.

18. The semiconductor device according to claim 1, wherein a number of the semiconductor integrated circuit section is one, a number of the optical wiring section is plural, and the plurality of optical wiring sections are electrically connected to the one semiconductor integrated circuit section.

19. The semiconductor device according to claim 1, wherein a number of the semiconductor integrated circuit section is plural, a number of the optical wiring section is one, and the plurality of semiconductor integrated circuit sections are electrically connected to the one optical wiring section.

20. The semiconductor device according to claim 1, wherein the optical active element is selected from the group consisting of a photodiode, a laser diode, a Mach-Zehnder type optical conversion element, a PN diode type optical convertor, an optical gate switch element, and an optical path switch element.

* * * * *